(12) United States Patent
Ohsawa et al.

(10) Patent No.: US 8,003,977 B2
(45) Date of Patent: Aug. 23, 2011

(54) LIGHT EMITTING DEVICE HAVING A LIGHT EMITTING LAMINATED BODY COMPRISING AN ORGANIC COMPOUND

(75) Inventors: Nobuharu Ohsawa, Kanagawa (JP); Yuji Iwaki, Kanagawa (JP); Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 858 days.

(21) Appl. No.: 11/500,248

(22) Filed: Aug. 7, 2006

(65) Prior Publication Data

US 2007/0034856 A1 Feb. 15, 2007

(30) Foreign Application Priority Data

Aug. 11, 2005 (JP) ................. 2005-233603

(51) Int. Cl.
*H01L 51/54* (2006.01)
(52) U.S. Cl. .................. 257/40; 257/101; 257/E51.024
(58) Field of Classification Search .............. 257/40, 257/E51.018, E51.022, 101; 313/504
See application file for complete search history.

(56) References Cited

U.S. PATENT DOCUMENTS

| | | | |
|---|---|---|---|
| 6,097,147 A | 8/2000 | Baldo et al. | |
| 6,580,213 B2 | 6/2003 | Yamazaki | 313/506 |
| 6,734,457 B2 | 5/2004 | Yamazaki et al. | 257/40 |
| 7,053,545 B2 | 5/2006 | Yamazaki | 313/504 |
| 7,816,668 B2 | 10/2010 | Kawakami et al. | |
| 2002/0121860 A1* | 9/2002 | Seo et al. | 313/506 |
| 2002/0197462 A1* | 12/2002 | Forrest et al. | 428/212 |
| 2003/0197467 A1* | 10/2003 | Adachi et al. | 313/504 |
| 2004/0048101 A1* | 3/2004 | Thompson et al. | 428/690 |

(Continued)

FOREIGN PATENT DOCUMENTS

EP 1 667 494 A1 6/2006

(Continued)

OTHER PUBLICATIONS

Fujikawa, H. et al, "Energy Structures of Triphenylamine Oligomers," Synthetic Metals, vol. 91, pp. 161-162, (1997).

(Continued)

*Primary Examiner* — Wael M Fahmy
*Assistant Examiner* — Abul Kalam
(74) *Attorney, Agent, or Firm* — Husch Blackwell LLP

(57) ABSTRACT

It is an object of the present invention to provide a light emitting element with improved luminous efficiency, a reduced drive voltage, and improved degree of deterioration with respect to driving time. According to a light emitting element including a first electrode; a second electrode; and a light emitting laminated body formed therebetween, the light emitting laminated body has at least a first layer, a second layer, and a third layer in this order, the first layer is a layer having a carrier transporting property, the third layer is a layer including an emission center material and a host material in which the emission center material is dispersed, the second layer has an energy gap larger than that of the first layer and equal to or larger than that of the host material, and the second layer has a thickness of 0.1 nm or more and less than 5 nm.

14 Claims, 20 Drawing Sheets

U.S. PATENT DOCUMENTS

| | | | |
|---|---|---|---|
| 2004/0086743 A1* | 5/2004 | Brown et al. | 428/690 |
| 2004/0124425 A1 | 7/2004 | Yamazaki et al. | 257/79 |
| 2005/0079385 A1* | 4/2005 | Nomura et al. | 428/690 |
| 2005/0136289 A1* | 6/2005 | Chu et al. | 428/690 |
| 2006/0227079 A1 | 10/2006 | Kashiwabara | |
| 2006/0273714 A1* | 12/2006 | Forrest et al. | 313/504 |

FOREIGN PATENT DOCUMENTS

| | | |
|---|---|---|
| JP | 2005-100921 | 4/2005 |
| JP | 2005-108730 | 4/2005 |

OTHER PUBLICATIONS

Chen, C.H. et al, "Recent Developments in Molecular Organic Electroluminescent Materials," Macromol. Symp., vol. 125, pp. 1-48, (1997).

Adamovich, V.I. et al, "New Charge-Carrier Blocking Materials for High Efficiency OLEDs," Organic Electronics, vol. 4, pp. 77-87, (2003).

Office Action re Chinese Application No. CN 200610111189.7, dated Jan. 9, 2009 (with English translation).

* cited by examiner

LIGHT EMITTING DEVICE HAVING A LIGHT EMITTING LAMINATED BODY COMPRISING AN ORGANIC COMPOUND

BACKGROUND OF THE INVENTION

1. Field of the Invention

The present invention relates to a light emitting element using an organic compound at least in part thereof. Moreover, the present invention relates to a light emitting device and an electronic device provided with the light emitting element.

2. Description of the Related Art

A light emitting device using a light emitting element, which has a layer including an organic material between a pair of electrodes and emits light by feeding current between the electrodes, has been developed. Such a light emitting device has advantages in a thin shape, lightweight, favorable visibility due to self-light emission, and fast response compared with another display device which is referred to as a thin display device. Therefore, such a light emitting device has been actively developed as a next-generation display device and is partly put into practical use at present.

Such a light emitting device which is advantageous to be a thin shape and lightweight is especially suitable for application to a mobile device. The lower power consumption of a light emitting device mounted to a mobile device in which battery is limited, the better, and power saving is always requested. In addition, a requirement of reducing energy consumption is more and more increased in association with an environmental problem, an energy problem, and the like in a television, a display, and the like in addition to a mobile device.

By the way, one of the reasons that such a light emitting device is limited to a partial practical use is deterioration of a light emitting element. A light emitting element is deteriorated such that luminance is lowered in accordance with the accumulation of driving time even if the same amount of current is fed. One of the reasons is that a material and a structure for manufacturing a light emitting element in which the degree of the deterioration is acceptable as an actual product has not been so varied yet.

Various methods for reducing deterioration of a light emitting element are conceivable, and one of the methods is to improve luminous efficiency. By the improvement of luminous efficiency, the same luminance can be obtained even if the amount of current to be fed to a light emitting element is small, which results in reduction in deterioration of the light emitting element.

If luminous efficiency is improved, the same luminance can be obtained with lower power, which leads to a low drive voltage and low power consumption.

For example, in Patent Document 1 (Patent Document 1: Japanese Patent Laid-Open No. 2005-108730), the improvement of luminous efficiency is attempted by controlling concentration of dopant in a light emitting layer in a thickness direction of the light emitting layer.

SUMMARY OF THE INVENTION

It is an object of the present invention to provide a light emitting element with improved luminous efficiency.

It is another object of the present invention to provide a light emitting element with a reduced drive voltage.

It is another object of the present invention to provide a light emitting element with improved degree of deterioration with respect to driving time.

It is another object of the present invention to provide an electronic device or a light emitting device with reduced power consumption.

It is another object of the present invention to provide an electronic device or a light emitting device with high reliability in a display portion.

A light emitting element of the present invention includes a first electrode; a second electrode; and a light emitting laminated body formed therebetween, where the light emitting laminated body has at least a first layer, a second layer, and a third layer in this order, the first layer is a layer having a carrier transporting property, the third layer is a layer including an emission center material and a host material in which the emission center material is dispersed, the second layer has an energy gap larger than that of the first layer and equal to or larger than that of the host material, and the second layer has a thickness of 0.1 nm or more and less than 5 nm.

A light emitting element of the present invention includes a first electrode; a second electrode; and a light emitting laminated body formed therebetween, where the light emitting laminated body has at least a first layer, a second layer, and a third layer in this order, the first layer is a layer having a carrier transporting property, the third layer is a layer including an emission center material and a host material in which the emission center material is dispersed, the second layer has an energy gap larger than that of the first layer and equal to or larger than that of the host material, and the second layer has a thickness of 0.5 nm or more and 3 nm or less.

A light emitting element of the present invention includes a first electrode; a second electrode; and a light emitting laminated body formed therebetween, where the light emitting laminated body has at least a first layer, a second layer, and a third layer in this order, the first layer is a layer having a carrier transporting property, the third layer is a layer including an emission center material and a host material in which the emission center material is dispersed, the second layer has an energy gap larger than that of the first layer and equal to or larger than that of the host material, and the second layer has a thickness of 1 nm or more and 2 nm or less.

FIG. 18 shows a view in which energy gaps of a first layer, a second layer, and a host material in a third layer, which are included in a light emitting laminated body, are compared with each other. When an energy gap of the first layer is set to $Eg_1$, an energy gap of the second layer is set to $Eg_2$, and an energy gap of the host material of the third layer is set to $Eg_3$, $Eg_2$ is set to be larger than $Eg_3$ and larger than $Eg_1$. It is to be noted that an energy gap denotes an energy gap between a LUMO level and a HOMO level.

In FIG. 18, a LUMO level of the second layer is higher than LUMO levels of the first layer and the third layer, the LUMO level of the first layer is higher than the LUMO level of the third layer, the HOMO level of the second layer is lower than HOMO levels of the first layer and the third layer, and the HOMO level of the third layer is lower than the HOMO level of the first layer. However, the present invention is not limited thereto.

By forming the second layer, excitation energy of an emission center material or a host material included in the third layer can be prevented from moving to a layer having a smaller energy gap. Accordingly, reduction in light emission and in color purity of light emission can be suppressed.

A light emitting element of the present invention includes a first electrode; a second electrode; and a light emitting laminated body formed therebetween, where the light emitting laminated body has at least a first layer, a second layer, a third layer, a fourth layer, and a fifth layer in this order, the first layer and the fifth layer are layers each having a carrier transporting property, the third layer is a layer including an emission center material and a host material in which the emission center material is dispersed, the second layer has an energy gap larger than the first layer and equal to or larger than that of the host material, the fourth layer has an energy gap larger than the fifth layer and equal to or larger than that of the host material, and the second layer and the fourth layer have a thickness of 0.1 nm or more and less than 5 nm.

A light emitting element of the present invention includes a first electrode; a second electrode; and a light emitting laminated body formed therebetween, where the light emitting laminated body has at least a first layer, a second layer, a third layer, a fourth layer, and a fifth layer in this order, the first layer and the fifth layer are layers each having a carrier transporting property, the third layer is a layer including an emission center material and a host material in which the emission center material is dispersed, the second layer has an energy gap larger than the first layer and equal to or larger than that of the host material, the fourth layer has an energy gap larger than the fifth layer and equal to or larger than that of the host material, and the second layer and the fourth layer have a thickness of 0.5 nm or more and 3 nm or less.

A light emitting element of the present invention includes a first electrode; a second electrode; and a light emitting laminated body formed therebetween, where the light emitting laminated body has at least a first layer, a second layer, a third layer, a fourth layer, and a fifth layer in this order, the first layer and the fifth layer are layers each having a carrier transporting property, the third layer is a layer including an emission center material and a host material in which the emission center material is dispersed, the second layer has an energy gap larger than the first layer and equal to or larger than that of the host material, the fourth layer has an energy gap larger than the fifth layer and equal to or larger than that of the host material, and the second layer and the fourth layer have a thickness of 1 nm or more and 2 nm or less.

FIG. 22 shows a view in which energy gaps of a first layer, a second layer, a host material in a third layer, a fourth layer, and a fifth layer, which are included in a light emitting laminated body, are compared with each other. When an energy gap of the first layer is set to $Eg_1$, an energy gap of the second layer is set to $Eg_2$, an energy gap of the host material of the third layer is set to $Eg_3$, an energy gap of the fourth layer is set to $Eg_4$, and an energy gap of the fifth layer is set to $Eg_5$, $Eg_2$ is larger than $Eg_3$ and larger than $Eg_1$, and $Eg_4$ is larger than $Eg_3$ and larger than $Eg_5$. It is to be noted that $Eg_2$ and $Eg_4$ may be the same or different from each other, and $Eg_1$ and $Eg_5$ may be the same or different from each other.

In FIG. 22, a LUMO level of the second layer is higher than LUMO levels of the first layer and the host material of the third layer, the LUMO level of the first layer is higher than the LUMO level of the host material of the third layer, the HOMO level of the second layer is lower than HOMO levels of the first layer and the host material of the third layer, and the HOMO level of the host material of the third layer is lower than the HOMO level of the first layer. However, the present invention is not limited thereto.

Further, in FIG. 22, the LUMO level of the fourth layer is higher than LUMO levels of the host material of the third layer and the fifth layer, the LUMO level of the fifth layer is higher than the LUMO level of host material of the third layer, the HOMO level of the fourth layer is lower than HOMO levels of the host material of the third layer and the fifth layer, and the HOMO level of the host material of the third layer is lower than the HOMO level of the fifth layer. However, the present invention is not limited thereto.

However, the LUMO level of the second layer and the LUMO level of the fourth layer, the HOMO level of the second layer and the HOMO level of the fourth layer, the LUMO level of the first layer and the LUMO level of the fifth layer, and the HOMO level of the first layer and the HOMO level of the fifth layer may be the same or different from each other.

According to the present invention, excitation energy of an emission center material or a host material included in a light emitting layer can be prevented from moving to a layer having a smaller energy gap. Therefore, reduction in light emission and in color purity of light emission can be suppressed.

According to the present invention, a light emitting element with improved luminous efficiency can be provided.

According to the present invention, a light emitting element with a reduced drive voltage can be provided.

According to the present invention, a light emitting element, in which degree of deterioration with respect to driving time is improved, can be provided.

According to the present invention, an electronic device or a light emitting device with reduced power consumption can be provided.

According to the present invention, an electronic device or a light emitting device with high reliability in a display portion can be provided.

DETAILED DESCRIPTION OF THE INVENTION

Hereinafter, embodiment modes of the present invention will be explained with reference to the accompanied drawings. However, the present invention can be implemented in various embodiments, and it is to be easily understood that various changes and modifications in modes and details thereof will be apparent to those skilled in the art. Therefore, it should be noted that the present invention should not be interpreted as being limited to the description of embodiment modes.

Embodiment Mode 1

Figure 1A:
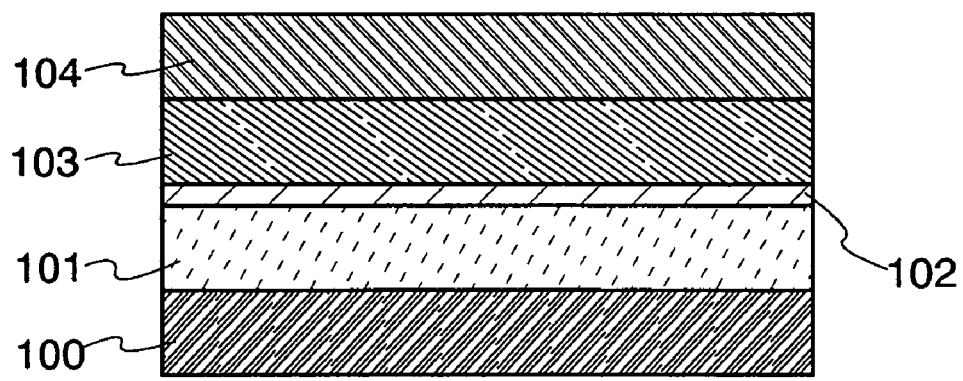
FIGS. 1A and 1B are views showing a light emitting element of the present invention.

FIG. 1A is a schematic view showing one structure of a light emitting element of the present invention. The light emitting element of the present invention shown by FIG. 1A has a light emitting laminated body including a first layer 101, a second layer 102, and a third layer 103 between a first electrode 100 and a second electrode 104. The first layer 101, the second layer 102, and the third layer 103 are laminated in this order from a first electrode 100 side.

The first layer 101 is a layer having a high transporting property of carriers injected from the first electrode 100 (carrier transporting layer), and the third layer 103 is a light emitting layer for obtaining desired light emission. The third layer 103, which is a light emitting layer, has a structure in which a material to be an emission center (emission center material) is dispersed in a host material.

The second layer 102 has an energy gap larger than that of the first layer 101 and equal to or larger than that of the host material. In addition, the second layer 102 is made of a material which can transport carriers injected from the first electrode 100. It is acceptable as long as the second layer 102 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level. An energy gap is obtained from a wavelength of an absorption edge on the longer wavelength side of the absorption spectrum when the absorption spectrum of each material in a thin film state is measured with an UV/VIS spectrophotometer.

In a case where light emission is obtained in applying a voltage of a certain level or more to the first electrode 100 of the light emitting element of the present invention having such a structure so that a potential of the first electrode 100 is higher than that of the second electrode 104, carriers transported by the first layer 101 are holes and the second layer 102 is made of a material which can transport holes.

In a case where light emission is obtained in applying a voltage of a certain level or more to the first electrode 100 so that a potential of the first electrode 100 is lower than that of the second electrode 104, carriers transported by the first layer 101 are electrons and the second layer 102 is made of a material which can transport electrons.

Although the second layer 102 is expressed as a film in this specification, there is a possibility that the second layer 102 is too thin to be a complete film shape, and that the second layer 102 is formed in an island-like shape. Even in such a case, the structure of the present invention functions effectively. In the present invention, in a case of forming the second layer 102, a calibration curve of evaporation time against evaporation thickness is created under the same evaporation condition as a case of actually forming the second layer, and it is considered that the second layer 102 having a specific thickness is formed by evaporation for a period required for a desired thickness on the calibration curve.

According to such a light emitting element, an emission center material is excited when electrons and holes injected from the electrode are recombined in a light emitting layer, and light emission can be obtained when the excited emission center material returns to a ground state. Excitation by recombination is classified into a case where an emission center material is directly excited by recombination and a case where a host material is excited first by recombination and an emission center material is excited by movement of excitation energy thereof.

At this time, when a layer having an energy gap smaller than that of a material which forms a light emitting layer is formed to be in contact with the light emitting layer, excitation energy of an emission center material or a host material of the light emitting layer moves to the layer having a smaller energy gap. If excitation energy moves from the light emitting layer to the layer having a smaller energy gap, light emission obtained from the light emitting layer is reduced for that. Moreover, color purity of light obtained from the light emitting element is also reduced in a case where the layer having a smaller energy gap has a light emitting property.

Therefore, a layer formed to be in contact with a light emitting layer desirably has an energy gap larger than that of a host material. In an actual element, although a layer formed to be in contact with a light emitting layer is a transporting layer of carriers or a layer serving to inject and transport carriers, a range of choice of a material satisfying relation between a transporting property or an injecting property of carriers and an energy gap is not so large. In particular, the range is narrower in a blue light emitting element which requires a large energy gap.

Here, in a light emitting element shown in FIG. 1A, which is a light emitting element of the present invention, the second layer 102 is formed between the third layer 103, which is a light emitting layer, and the first layer 101, which is a carrier transporting layer. As described above, the second layer 102 has an energy gap larger than that of the first layer 101 and equal to or larger than that of the host material and is formed to have a thickness of 0.1 nm or more and less than 5 nm, preferably 0.5 nm or more and 3 nm or less, and more preferably 1 nm or more and 2 nm or less.

By providing such a second layer 102, even if an energy gap of the third layer 103 is smaller than that of the first layer 101, movement of excitation energy from the third layer 103 to the first layer 101 can be effectively suppressed. As a result, a light emitting element with improved luminous efficiency can be obtained.

Moreover, a light emitting element can be obtained, in which a drive voltage is hardly increased compared with a normal element in which the second layer 102 is not formed. In addition, a range of choice of a material which can be used for the first layer 101, which is a carrier transporting layer, can be drastically widened because of the existence of the second layer 102.

It is to be noted that a low carrier transporting property of the second layer 102 is acceptable as long as the relation of energy gaps is satisfied and carriers can flow. Further, the second layer 102 is extremely thin. Therefore, a material, because of which reliability of a light emitting element itself becomes conventionally low owing to reliability of the material itself when the material is used for other layers, can be used as a material for the second layer 102 without reduction in reliability of a light emitting element. This is a great feature of the present invention.

According to the light emitting element of the present invention, by including such a second layer 102, movement of excitation energy from the third layer 103 to the first layer 101 is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained. In addition, a drive voltage can also be reduced. It is to be noted that, in the light emitting element of the present invention, the second layer 102 is extremely thin; therefore, increase in a drive voltage due to the formation of the second layer 102 is not caused. Accordingly, an effect of reducing a drive voltage accompanied with the improvement of luminous efficiency becomes further remarkable.

In the light emitting element of the present invention, a light emitting region in the third layer 103, which is a light emitting layer, exists uniformly in a thickness direction of the third layer 103 or in the center of the thickness in some cases. However, in most cases, the light emitting region exists nonuniformly in the vicinity of either surface in a thickness direction. Accordingly, the second layer 102 is preferably provided on a side where the light emitting region exists nonuniformly.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element. It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function.

As a material for these electrodes, metal; alloy; an electrically conductive compound; or mixture metal, a compound, or alloy of these can be used. For example, metal having conductivity such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); alloy such as aluminum-silicon (Al—Si), aluminum-titanium (Al—Ti), or aluminum-silicon-copper (Al—Si—Cu); nitride of a metal material such as titanium nitride (TiN); metal oxide such as indium tin oxide (ITO), indium tin oxide containing silicon oxide (in this specification, referred to as ITSO), or an object formed by mixing zinc oxide (ZnO) of 2 to 20 wt % in indium oxide (in this specification, referred to as IZO (indium zinc oxide)); or the like can be used.

It is to be noted that ITO, ITSO, IZO, or the like can be preferably used as a material for an electrode through which light emission is extracted because it is a conductive material having a light transmitting property. In addition, aluminum, silver, or the like, which does not transmit light when formed as a thick film, has a light transmitting property when formed as a thin film, so that a thin film of aluminum, silver, or the like can be used as an electrode having a light transmitting property. Aluminum, silver, or the like has high reflectance; therefore, aluminum, silver, or the like can be used as a reflective electrode by being formed to have a thickness of a certain degree or more. These electrodes can be formed by a known method such as a sputtering method or an evaporation method.

In a case where light emission is obtained in applying a voltage of a certain level or more to the first electrode 100 so that a potential of the first electrode 100 is higher than that of the second electrode 104, the first layer 101 is made of a material having a high hole transporting property. Alternatively, in a case where light emission is obtained in applying a voltage of a certain level or more to the first electrode 100 so that a potential of the first electrode 100 is lower than that of the second electrode 104, the first layer 101 is made of a material having a high electron transporting property.

As a material having a high hole transporting property, specifically, 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), and the like are given. Further, the layer having a high hole transporting property may have a multilayer structure formed by combining two or more layers made of the substance described above.

As a material having a high electron transporting property, specifically, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-H-benzimidazole) (abbreviation: TPBI), 4,4-bis(5-methylbenzoxazol-2-yl)stilbene (abbreviation: BzOs), and the like are given as well as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOX)_2$), and bis[2-(2-hydroxyphenyl)benzothiazolato]zinc (abbreviation: $Zn(BTZ)_2$). In addition, the layer having a high electron transporting property may have a multilayer structure formed by combining two or more layers made of the substance described above. The first layer 101 may be formed by a known method such as an evaporation method.

The second layer 102 is made of a material which can pass holes in a case where light emission is obtained in applying a voltage of a certain level or more to the first electrode 100 so that a potential of the first electrode 100 is higher than that of the second electrode 104. Alternatively, the second layer 102 is made of a material which can pass electrons in a case where light emission can be obtained in applying a voltage of a certain level or more so that a potential of the first electrode 100 is lower than that of the second electrode 104.

The material which can pass holes or electrons denotes a material other than a material which disturbs flow of the carriers such as a blocking material, and mobility may be extremely low. Among the materials described above, a material having an energy gap larger than that of the first layer 101 and equal to or larger than that of the host material may be used for the second layer 102.

As the material which can pass holes, for example, 4,4'-di(N-carbazolyl)biphenyl (abbreviation: CBP), 2,7-di(N-carbazolyl)-spiro-9,9'-bifluorene (abbreviation: SFDCz), 4,4',4"-tris[N-(3-methylphenyl)-N-phenylamino]triphenylamine (abbreviation: m-MTDATA), 2,7-bis{N-[4-(N-carbazolyl)phenyl]-N-phenylamino}-spiro-9,9'-bifluorene (abbreviation: YGASF), 1,3,5-tri(N-carbazolyl)benzene (abbreviation: TCzB), 4,4',4"-tri(N-carbazolyl)triphenylamine (abbreviation: TCTA), and the like can be given though it depends on the first layer 101 and the host material.

As the material which can pass electrons, bis[2-(2-hydroxyphenyl)benzoxazolato]zinc (abbreviation: $Zn(BOX)_2$), bis[2-(2-hydroxyphenyl)pyridinato]zinc (abbreviation: $Zn(pp)_2$), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), bathocuproin (abbreviation: BCP), 2,2',2"-(1,3,5-benzenetriyl)-tris(1-phenyl-1H-benzimidazole) (abbreviation: TPBI), and the like can be given.

As a matter of course, these are only illustrative and a material which can be used for the present invention is not limited thereto. There is fear that luminous efficiency is decreased because an exciplex is unfortunately formed when a HOMO level of the emission center material and a LUMO level of the second layer 102 are close to each other or a LUMO level of the emission center material and a HOMO level of the second layer 102 are close to each other. In order to prevent decrease in luminous efficiency due to the formation of an exciplex, it is preferable to select a material in which a HOMO level of the emission center material and a LUMO level of the second layer 102 are separated from each other or a LUMO level of the emission center material and a HOMO level of the second layer 102 are separated from each other such that an exciplex is not formed. The second layer 102 may be formed by a known method such as an evaporation method.

The third layer 103 is formed by dispersing an emission center substance, which has an energy gap smaller than that of a host material, in the host material. The third layer 103 can be formed by co-evaporating an emission center substance and a host material.

The emission center substance is not particularly limited, and a substance which has favorable luminous efficiency and can emit light at a desired emission wavelength may be used. Specifically, when reddish emission is desired to be obtained, a substance which exhibits emission with a peak from 600 to 680 nm in an emission spectrum such as 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyl-9-julolidine-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, or the like can be used.

When greenish emission is desired to be obtained, a substance which exhibits emission with a peak from 500 to 550 nm in an emission spectrum such as N,N'-dimethylquinacridone (abbreviation: DMQd), coumarin 6, coumarin 545T, tris(8-quinolinolato)aluminum (abbreviation: $Alq_3$), or the like can be used.

In addition, when bluish emission is desired to be obtained, a substance which exhibits emission with a peak from 420 to 500 nm in an emission spectrum such as 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), 9-(4-{N-[4-(9-carbazolyl)phenyl]-N-phenylamino}phenyl)-10-phenylanthracene (abbreviation: YGAPA), or the like can be used.

As mentioned above, as well as a substance which emits fluorescence, a substance which emits phosphorescence such as bis[2-(3,5-bis(trifluoromethyl)phenyl)pyridinato-N,$C^{2'}$]iridium(III)picolinate (abbreviation: $Ir(CF_3ppy)_2(pic)$), bis[2-(4,6-difluorophenyl)pyridinato-N,$C^{2'}$]iridium(III)acetylacetonate (abbreviation: FIr(acac)), bis[2-(4,6-difluorophenyl)pyridinato-N,$C^{2'}$]iridium(III)picolinate (abbreviation: FIr(pic)), tris(2-phenylpyridinato-N,$C^{2'}$)iridium (abbreviation: $Ir(ppy)_3$), or the like can also be used as the light emitting substance.

In addition, as for the host material, for example, a metal complex or the like such as bis[2-(2-hydroxyphenyl)pyridinato]zinc (abbreviation: $Znpp_2$), bis[2-(2-hydroxyphenyl)benzoxazolato]zinc (abbreviation: ZnBOX), or 9-[4-(N-carbazolyl)]phenyl-10-phenylanthracene (abbreviation: CzPA) can be used as well as an anthracene derivative such as 9,10-di(2-naphthyl)-2-tert-butylanthracene (abbreviation: t-BuDNA) or a carbazole derivative such as 4,4'-di(N-carbazolyl) biphenyl (abbreviation: CBP).

Embodiment Mode 2

Figure 1B:
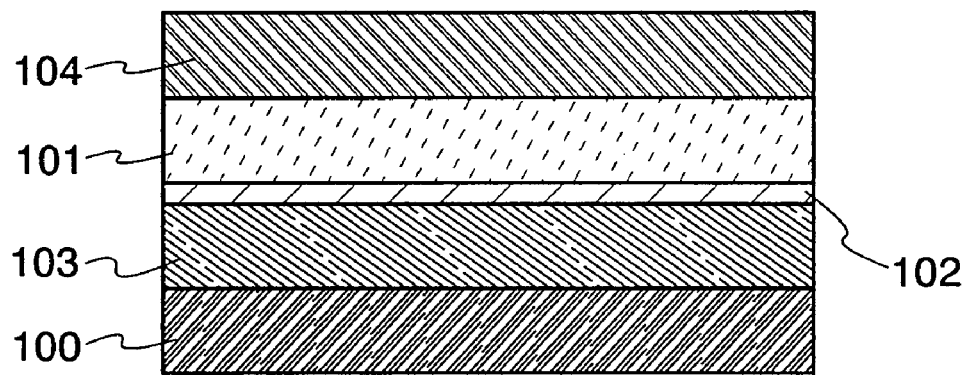

FIG. 1B is a schematic view showing one structure of a light emitting element of the present invention. The light emitting element of the present invention shown by FIG. 1B has a light emitting laminated body including a first layer 101, a second layer 102, and a third layer 103 between a first electrode 100 and a second electrode 104. FIG. 1B and FIG. 1A are different from each other in terms of a structure in which the third layer 103, the second layer 102, and the first layer 101 are laminated in this order from a first electrode 100 side in FIG. 1B. Such a structure may be used for the present invention.

The first layer 101 is a layer having a high transporting property of carriers injected from the second electrode 104 (carrier transporting layer), and the third layer 103 is a light emitting layer for obtaining desired light emission. The third layer 103, which is a light emitting layer, has a structure in which a material to be an emission center (emission center material) is dispersed in a host material.

The second layer 102 has an energy gap larger than that of the first layer 101 and equal to or larger than that of the host material. In addition, the second layer 102 is made of a material which can transport carriers injected from the second electrode 104. It is acceptable as long as the second layer 102 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level.

In a case where light emission is obtained in applying a voltage of a certain level or more to the first electrode 100 of the light emitting element of the present invention having such a structure so that a potential of the first electrode 100 is higher than that of the second electrode 104, carriers transported by the first layer 101 are electrons, and the first layer 101 serves as an electron transporting layer and is made of a material having a high electron transporting property. In addition, the second layer 102 is made of a material which can transport electrons.

Alternatively, in a case where light emission is obtained in applying a voltage of a certain level or more to the first electrode 100 so that a potential of the first electrode 100 is lower than that of the second electrode 104, carriers transported by the first layer 101 are holes, and the first layer 101 serves as a hole transporting layer and is made of a material having a high hole transporting property. The second layer 102 is made of a material which can transport holes.

A specific example of a material which can be used for the second layer 102 is the same as that described in Embodiment Mode 1; therefore, the explanation will not be repeated. In addition, a specific example of a material having a high hole transporting property or a material having a high electron transporting property used for the first layer 101 is the same as that described in Embodiment Mode 1.

Although the second layer 102 is expressed as a film in this specification, there is a possibility that the second layer 102 is too thin to be a complete film shape, and that the second layer 102 is formed in an island-like shape. Even in such a case, the structure of the present invention functions effectively. In the present invention, in a case of forming the second layer 102, a calibration curve of evaporation time against evaporation thickness is created under the same evaporation condition as a case of actually forming the second layer, and it is considered that the second layer 102 having a specific thickness is formed by evaporation for a period required for a desired thickness on the calibration curve.

Here, in a light emitting element shown in FIG. 1B, which is a light emitting element of the present invention, the second layer 102 is formed between the third layer 103, which is a light emitting layer, and the first layer 101, which is a carrier transporting layer. As described above, the second layer 102 has an energy gap larger than that of the first layer 101 and equal to or larger than that of the host material and is formed to have a thickness of 0.1 nm or more and less than 5 nm, preferably 0.5 nm or more and 3 nm or less, and more preferably 1 nm or more and 2 nm or less.

By providing such a second layer 102, even if an energy gap of the third layer 103 is smaller than that of the first layer 101, movement of excitation energy from the third layer 103 to the first layer 101 can be effectively suppressed. As a result, a light emitting element with improved luminous efficiency can be obtained.

Moreover, a light emitting element can be obtained, in which a drive voltage is hardly increased compared with a normal element in which the second layer 102 is not formed. In addition, a range of choice of a material which can be used for the first layer 101, which is a carrier transporting layer, can be drastically widened because of the existence of the second layer 102.

It is to be noted that a low carrier transporting property of the second layer 102 is acceptable as long as the relation of energy gaps is satisfied and carriers can flow. Further, the second layer 102 is extremely thin. Therefore, a material, because of which reliability of a light emitting element itself becomes conventionally low owing to reliability of the material itself when the material is used for other layers, can be used as a material for the second layer 102 without reduction in reliability of a light emitting element. This is one of great features of the present invention.

According to the light emitting element of the present invention, by including such a second layer 102, movement of excitation energy from the third layer 103 to the first layer 101 is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained. In addition, a drive voltage can also be reduced.

It is to be noted that, in the light emitting element of the present invention, the second layer 102 is extremely thin; therefore, increase in a drive voltage due to the formation of the second layer 102 is not caused. Accordingly, an effect of reducing a drive voltage accompanied with the improvement of luminous efficiency becomes further remarkable.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element.

It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function. A specific material for these electrodes is the same as that described in Embodiment Mode 1; therefore, the explanation will not be repeated.

Further, the emission center substance and the host material are also the same as that described in Embodiment Mode 1.

The matter other than that explained in this embodiment mode is the same as Embodiment Mode 1, and refer to the explanation in Embodiment Mode 1.

Embodiment Mode 3

Figure 2A:
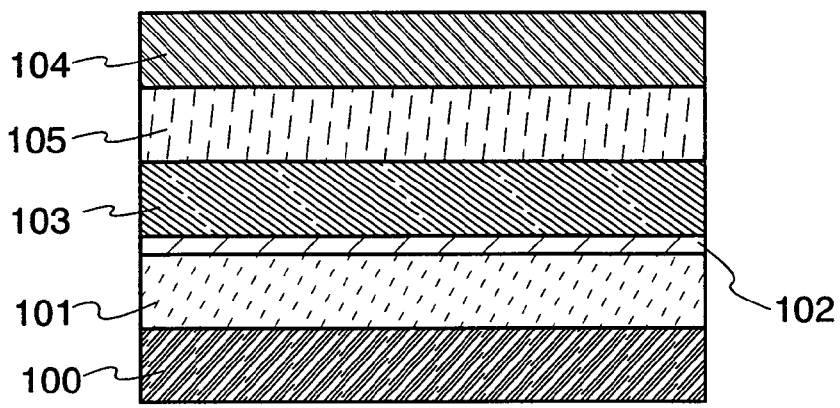
FIGS. 2A to 2C are views showing a light emitting element of the present invention.

FIG. 2A is a schematic view showing one structure of a light emitting element of the present invention. A light emitting element of the present invention shown by FIG. 2A has a light emitting laminated body including a first layer 101, a second layer 102, a third layer 103, and a fourth layer 105 between a first electrode 100 and a second electrode 104. FIG. 2A and FIG. 1A are different from each other in terms of a structure in which the fourth layer 105 is provided between the third layer 103 and the second electrode 104 in FIG. 2A. Such a structure may be used for the present invention.

The first layer 101 is a layer having a high transporting property of carriers injected from the first electrode 100 or a layer having a high injecting property and a high transporting property, and the fourth layer 105 is a layer having a high transporting property of carriers injected from the second electrode 104 (carrier transporting layer). The third layer 103 is a light emitting layer for obtaining desired light emission. The third layer 103, which is a light emitting layer, has a structure in which a material to be an emission center (emission center material) is dispersed in a host material.

The second layer 102 has an energy gap larger than that of the first layer 101 and equal to or larger than that of the host material. In addition, the second layer 102 is made of a material which can transport carriers injected from the first electrode 100. It is acceptable as long as the second layer 102 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level.

By providing the fourth layer 105, carriers can be injected and transported from the second electrode 104 more smoothly.

In a case where light emission is obtained in applying a voltage of a certain level or more to the first electrode 100 of the light emitting element of the present invention having such a structure so that a potential of the first electrode 100 is higher than that of the second electrode 104, carriers transported by the first layer 101 are holes, and the first layer 101 serves as a hole transporting layer and is made of a material having a high hole transporting property. Carriers transported by the fourth layer 105 are electrons, and the fourth layer 105 serves as an electron transporting layer and is made of a material having a high electron transporting property. In addition, the second layer 102 is made of a material which can transport holes.

In a case where light emission is obtained in applying a voltage of a certain level or more to the first electrode 100 so that a potential of the first electrode 100 is lower than that of the second electrode 104, carriers transported by the first layer 101 are electrons, and the first layer 101 serves as an electron transporting layer and is made of a material having a high electron transporting property. Carriers transported by the fourth layer 105 are holes, and the fourth layer 105 serves as a hole transporting layer and is made of a material having a high hole transporting property. The second layer 102 is made of a material which can transport electrons.

A specific example of a material which can be used for the second layer 102 is the same as that described in Embodiment Mode 1; therefore, the explanation will not be repeated. In addition, a specific example of a material having a high hole transporting property or a material having a high electron transporting property used for the first layer 101 is the same as that described in Embodiment Mode 1. It is to be noted that a material having a high hole transporting property or a material having a high electron transporting property used for the fourth layer 105 is the same as the material having a high hole transporting property or the material having a high electron transporting property given as the material for the first layer 101 in Embodiment Mode 1; therefore, refer to the description.

Although the second layer 102 is expressed as a film in this specification, there is a possibility that the second layer 102 is too thin to be a complete film shape, and that the second layer 102 is formed in an island-like shape. Even in such a case, the structure of the present invention functions effectively. In the present invention, in a case of forming the second layer 102, a calibration curve of evaporation time against evaporation thickness is created under the same evaporation condition as a case of actually forming the second layer, and it is considered that the second layer 102 having a specific thickness is formed by evaporation for a period required for a desired thickness on the calibration curve.

Here, in a light emitting element shown in FIG. 2A, which is a light emitting element of the present invention, the second layer 102 is formed between the third layer 103, which is a light emitting layer, and the first layer 101, which is a carrier transporting layer. As described above, the second layer 102 has an energy gap larger than that of the first layer 101 and equal to or larger than that of the host material and is formed to have a thickness of 0.1 nm or more and less than 5 nm, preferably 0.5 nm or more and 3 nm or less, and more preferably 1 nm or more and 2 nm or less.

By providing such a second layer 102, even if an energy gap of the third layer 103 is smaller than that of the first layer 101, movement of excitation energy from the third layer 103 to the first layer 101 can be effectively suppressed. As a result, a light emitting element with improved luminous efficiency can be obtained.

Moreover, a light emitting element can be obtained, in which a drive voltage is hardly increased compared with a normal element in which the second layer 102 is not formed. In addition, a range of choice of a material which can be used for the first layer 101, which is a carrier transporting layer, can be drastically widened because of the existence of the second layer 102.

It is to be noted that a low carrier transporting property of the second layer 102 is acceptable as long as the relation of energy gaps is satisfied and carriers can flow. Further, the second layer 102 is extremely thin. Therefore, a material, because of which reliability of a light emitting element itself becomes conventionally low owing to reliability of the material itself when the material is used for other layers, can be used as a material for the second layer 102 without reduction in reliability of a light emitting element. This is one of great features of the present invention.

According to the light emitting element of the present invention, by including such a second layer 102, movement of excitation energy from the third layer 103 to the first layer 101 is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained. In addition, a drive voltage can also be reduced. It is to be noted that, in the light emitting element of the present invention, the second layer 102 is extremely thin; therefore, increase in a drive voltage due to the formation of the second layer 102 is not caused. Accordingly, an effect of reducing a drive voltage accompanied with the improvement of luminous efficiency becomes further remarkable.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element. It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function. A specific material for these electrodes is the same as that described in Embodiment Mode 1; therefore, the explanation will not be repeated.

Further, the emission center substance and the host material are also the same as that described in Embodiment Mode 1.

The matter other than that explained in this embodiment mode is the same as Embodiment Mode 1, and refer to the explanation in Embodiment Mode 1.

Embodiment Mode 4

Figure 2B:
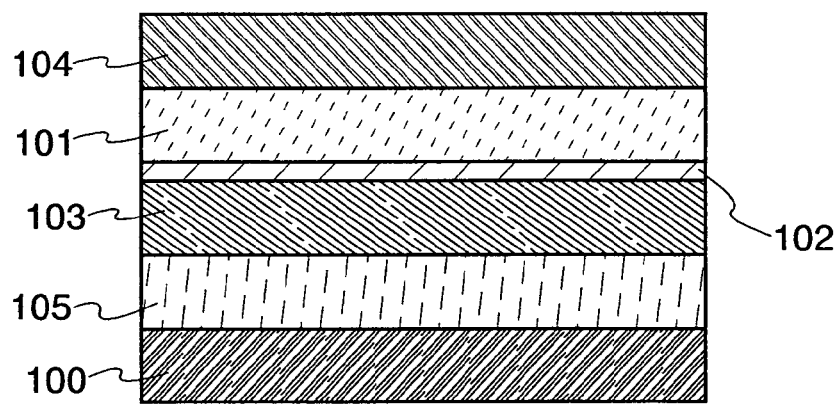

FIG. 2B is a schematic view showing one structure of a light emitting element of the present invention. A light emitting element of the present invention shown by FIG. 2B has a light emitting laminated body including a first layer 101, a second layer 102, a third layer 103, and a fourth layer 105 between a first electrode 100 and a second electrode 104. FIG. 2B and FIG. 2A are different from each other in terms of a structure in which the fourth layer 105, the third layer 103, the second layer 102, and the first layer 101 are laminated in this order from a first electrode 100 side in FIG. 2B. Such a structure may be used for the present invention.

The first layer 101 is a layer having a high transporting property of carriers injected from the second electrode 104, and the fourth layer 105 is a layer having a high transporting property of carriers injected from the first electrode 100 (carrier transporting layer). The third layer 103 is a light emitting layer for obtaining desired light emission. The third layer 103, which is a light emitting layer, has a structure in which a material to be an emission center (emission center material) is dispersed in a host material.

The second layer 102 has an energy gap larger than that of the first layer 101 and equal to or larger than that of the host material. In addition, the second layer 102 is made of a material which can transport carriers injected from the second electrode 104. It is acceptable as long as the second layer 102 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level.

By providing the fourth layer 105, carriers can be injected and transported from the first electrode 100 more smoothly.

In a case where light emission is obtained in applying a voltage of a certain level or more to the first electrode 100 of the light emitting element of the present invention having such a structure so that a potential of the first electrode 100 is higher than that of the second electrode 104, carriers transported by the first layer 101 are electrons, and the first layer 101 serves as an electron transporting layer and is made of a material having a high electron transporting property. Carriers transported by the fourth layer 105 are holes, and the fourth layer 105 serves as a hole transporting layer and is made of a material having a high hole transporting property. In addition, the second layer 102 is made of a material which can transport electrons.

Alternatively, in a case where light emission is obtained in applying a voltage of a certain level or more to the first electrode 100 so that a potential of the first electrode 100 is lower than that of the second electrode 104, carriers transported by the first layer 101 are holes, and the first layer 101 serves as a hole transporting layer and is made of a material having a high hole transporting property. Carriers transported by the fourth layer 105 are electrons, and the fourth layer 105 serves as an electron transporting layer and is made of a material having a high electron transporting property. The second layer 102 is made of a material which can transport holes.

A specific example of a material which can be used for the second layer 102 is the same as that described in Embodiment Mode 1; therefore, the explanation will not be repeated. In addition, a specific example of a material having a high electron transporting property or a material having a high hole transporting property used for the first layer 101 is the same as that described in Embodiment Mode 1. It is to be noted that a material having a high hole transporting property or a material having a high electron transporting property used for the fourth layer 105 is the same as the material having a high hole transporting property or the material having a high electron transporting property given as the material for the first layer 101 in Embodiment Mode 1; therefore, refer to the description.

Although the second layer 102 is expressed as a film in this specification, there is a possibility that the second layer 102 is too thin to be a complete film shape, and that the second layer 102 is formed in an island-like shape. Even in such a case, the structure of the present invention functions effectively. In the present invention, in a case of forming the second layer 102, a calibration curve of evaporation time against evaporation thickness is created under the same evaporation condition as a case of actually forming the second layer, and it is considered that the second layer 102 having a specific thickness is formed by evaporation for a period required for a desired thickness on the calibration curve.

Here, in a light emitting element shown in FIG. 2B, which is a light emitting element of the present invention, the second layer 102 is formed between the third layer 103, which is a light emitting layer, and the first layer 101, which is a carrier transporting layer. As described above, the second layer 102 has an energy gap larger than that of the first layer 101 and equal to or larger than that of the host material and is formed to have a thickness of 0.1 nm or more and less than 5 nm, preferably 0.5 nm or more and 3 nm or less, and more preferably 1 nm or more and 2 nm or less.

By providing such a second layer 102, even if an energy gap of the third layer 103 is larger than that of the first layer 101, movement of excitation energy from the third layer 103 to the first layer 101 can be effectively suppressed. As a result, a light emitting element with improved luminous efficiency can be obtained.

Moreover, a light emitting element can be obtained, in which a drive voltage is hardly increased compared with a normal element in which the second layer 102 is not formed. In addition, a range of choice of a material which can be used for the first layer 101, which is a carrier transporting layer, can be drastically widened because of the existence of the second layer 102.

It is to be noted that a low carrier transporting property of the second layer 102 is acceptable as long as the relation of energy gaps is satisfied and carriers can flow. Further, the second layer 102 is extremely thin. Therefore, a material, because of which reliability of a light emitting element itself becomes conventionally low owing to reliability of the material itself when the material is used for other layers, can be used as a material for the second layer 102 without reduction in reliability of a light emitting element. This is one of great features of the present invention.

According to the light emitting element of the present invention, by including such a second layer 102, movement of excitation energy from the third layer 103 to the first layer 101 is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained. In addition, a drive voltage can also be reduced. It is to be noted that, in the light emitting element of the present invention, the second layer 102 is extremely thin; therefore, increase in a drive voltage due to the formation of the second layer 102 is not caused. Accordingly, an effect of reducing a drive voltage accompanied with the improvement of luminous efficiency becomes further remarkable.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element.

It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function. A specific material for these electrodes is the same as that described in Embodiment Mode 1; therefore, the explanation will not be repeated.

Further, the emission center substance and the host material are also the same as that described in Embodiment Mode 1.

The matter other than that explained in this embodiment mode is the same as Embodiment Mode 1, and refer to the explanation in Embodiment Mode 1.

Embodiment Mode 5

Figure 2C:
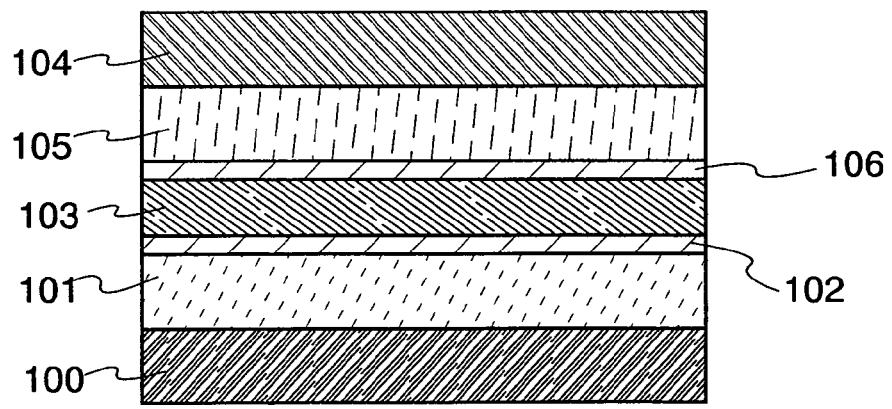

FIG. 2C is a schematic view showing one structure of a light emitting element of the present invention. A light emitting element of the present invention shown by FIG. 2C has a light emitting laminated body including a first layer 101, a second layer 102, a third layer 103, a fifth layer 106, and a fourth layer 105 between a first electrode 100 and a second electrode 104. FIG. 2C and FIG. 2A are different from each other in terms of a structure in which the fifth layer 106 is provided between the third layer 103 and the fourth layer 105 in FIG. 2C. Such a structure may be used for the present invention.

The first layer 101 is a layer having a high transporting property of carriers injected from the first electrode 100, and the fourth layer 105 is a layer having a high transporting property of carriers injected from the second electrode 104 (carrier transporting layer). The third layer 103 is a light emitting layer for obtaining desired light emission. The third layer 103, which is a light emitting layer, has a structure in which a material to be an emission center (emission center material) is dispersed in a host material.

The second layer 102 has an energy gap larger than that of the first layer 101 and equal to or larger than that of the host material. In addition, the second layer 102 is made of a material which can transport carriers injected from the first electrode 100.

The fifth layer 106 has an energy gap larger than that of the fourth layer 105 and equal to or larger than that of the host material. Further, the fifth layer 106 is made of a material which can transport carriers injected from the second electrode 104.

It is acceptable as long as each of the second layer 102 and the fifth layer 106 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level.

By providing the fifth layer 106, movement of excitation energy from the third layer 103 to the fourth layer 105 can be suppressed and luminous efficiency is further improved. Such a structure is particularly effective in a case where a light emitting region is formed in the entire region in a thickness direction of the third layer 103, which is a light emitting layer. Further, the present invention can be easily applied to such a structure even if a portion where a light emitting region is formed in the light emitting layer is obscure.

In a case where light emission is obtained in applying a voltage of a certain level or more to the first electrode 100 of the light emitting element of the present invention having such a structure so that a potential of the first electrode 100 is higher than that of the second electrode 104, carriers transported by the first layer 101 are holes, and the first layer 101 serves as a hole transporting layer and is made of a material having a high hole transporting property. Carriers transported by the fourth layer 105 are electrons, and the fourth layer 105 serves as an electron transporting layer and is made of a material having a high electron transporting property. In addition, the second layer 102 is made of a material which can transport holes and the fifth layer 106 is made of a material which can transport electrons.

Alternatively, in a case where light emission is obtained in applying a voltage of a certain level or more to the first electrode 100 so that a potential of the first electrode 100 is lower than that of the second electrode 104, carriers transported by the first layer 101 are electrons, and the first layer 101 serves as an electron transporting layer and is made of a material having a high electron transporting property. Carriers transported by the fourth layer 105 are holes, and the fourth layer 105 serves as a hole transporting layer and is made of a material having a high hole transporting property. The second layer 102 is made of a material which can transport electrons and the fifth layer 106 is made of a material which can transport holes.

A specific example of a material which can be used for the second layer 102 is the same as that described in Embodiment Mode 1; therefore, the explanation will not be repeated. A material which can be used for the fifth layer 106 is the same as a material which can be used for the second electrode 102; therefore, the explanation will not be repeated.

In addition, a specific example of a material having a high hole transporting property or a material having a high electron transporting property used for the first layer 101 is also the same as that described in Embodiment Mode 1. It is to be noted that a material having a high hole transporting property or a material having a high electron transporting property used for the fourth layer 105 is the same as the material having a high hole transporting property or the material having a high electron transporting property given as the material for the first layer 101 in Embodiment Mode 1; therefore, refer to the description.

Although the second layer 102 and the fifth layer 106 are expressed as films in this specification, there is a possibility that each of the second layer 102 and the fifth layer 106 is too thin to be a complete film shape, and that each of the second layer 102 and the fifth layer 106 is formed in an island-like shape. Even in such a case, the structure of the present invention functions effectively. In the present invention, in a case of forming the second layer 102 and the fifth layer 106, a calibration curve of evaporation time against evaporation thickness is created under the same evaporation condition as a case of actually forming the second layer 102 and the fifth layer 106, and it is considered that the second layer 102 and the fifth layer 106 each having a specific thickness is formed by evaporation for a period required for a desired thickness on the calibration curve.

Here, in a light emitting element shown in FIG. 2C, which is a light emitting element of the present invention, the second layer 102 is formed between the third layer 103, which is a light emitting layer, and the first layer 101, which is a carrier transporting layer, and the fifth layer 106 is formed between the third layer 103 and the fourth layer 105. As described above, the second layer 102 has an energy gap larger than that of the first layer 101 and equal to or larger than that of the host material, and the fifth layer 106 has an energy gap larger than that of the fourth layer 105 and equal to or larger than that of the host material. Each of the second layer 102 and the fifth layer 106 is formed to have a thickness of 0.1 nm or more and less than 5 nm, preferably 0.5 nm or more and 3 nm or less, and more preferably 1 nm or more and 2 nm or less.

By providing such a second layer 102 and a fifth layer 106, even if an energy gap of the third layer 103 is larger than that of the first layer 101 or the fourth layer 105, movement of excitation energy from the third layer 103 to the first layer 101 or the fourth layer 105 can be effectively suppressed. As a result, a light emitting element with improved luminous efficiency can be obtained.

Moreover, a light emitting element can be obtained, in which a drive voltage is hardly increased compared with a normal element in which the second layer 102 and the fifth layer 106 are not formed. In addition, a range of choice of a material which can be used for the first layer 101 or the fourth layer 105, which is a carrier transporting layer, can be drastically widened because of the existence of the second layer 102 or the fifth layer 106.

It is to be noted that low carrier transporting properties of the second layer 102 and the fifth layer 106 are acceptable as long as the relation of energy gaps is satisfied and carriers can flow. Further, the second layer 102 or the fifth layer 106 is extremely thin. Therefore, a material, because of which reliability of a light emitting element itself becomes conventionally low owing to reliability of the material itself when the material is used for other layers, can be used as a material for the second layer 102 or the fifth layer 106 without reduction in reliability of a light emitting element. This is one of great features of the present invention.

According to the light emitting element of the present invention, by including such a second layer 102 and a fifth layer 106, movement of excitation energy from the third layer 103 to the first layer 101 and the fourth layer 105 is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained. In addition, a drive voltage can also be reduced. It is to be noted that, in the light emitting element of the present invention, the second layer 102 and the fifth layer 106 are extremely thin; therefore, increase in a drive voltage due to the formation of these layers is not caused. Accordingly, an effect of reducing a drive voltage accompanied with the improvement of luminous efficiency becomes further remarkable.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element.

It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function. A specific material for these electrodes is the same as that described in Embodiment Mode 1; therefore, the explanation will not be repeated.

Further, the emission center substance and the host material are also the same as that described in Embodiment Mode 1.

The matter other than that explained in this embodiment mode is the same as Embodiment Mode 1, and refer to the explanation in Embodiment Mode 1.

Embodiment Mode 6

Figure 3A:
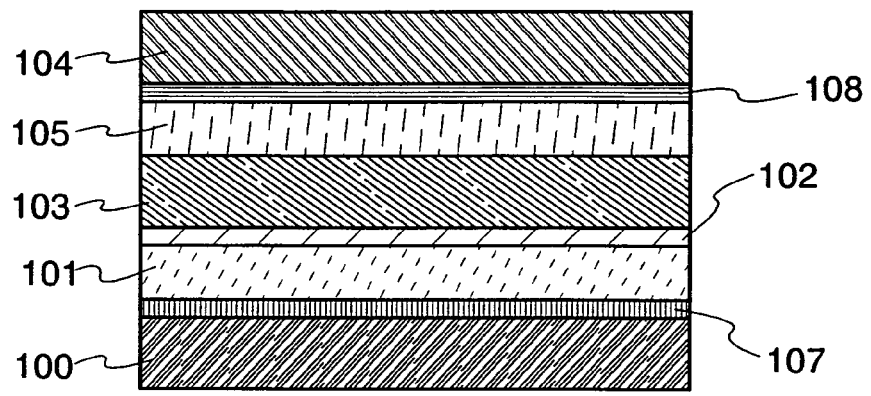
FIGS. 3A and 3B are views showing a light emitting element of the present invention.
Figure 3B:
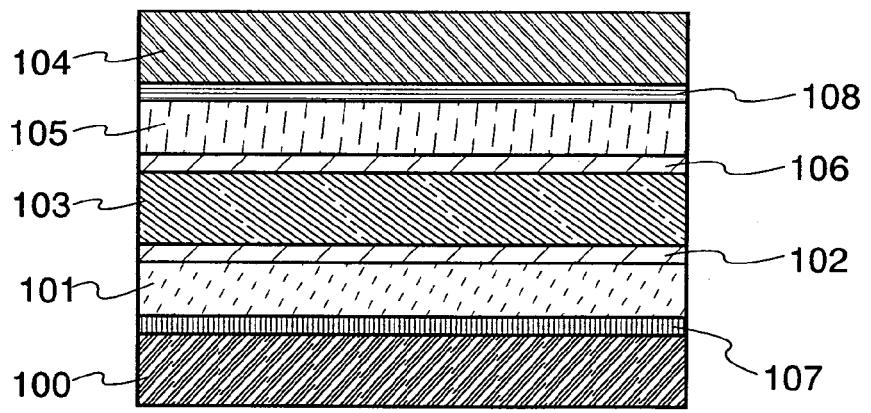

FIGS. 3A and 3B are schematic views each showing one structure of a light emitting element of the present invention. A light emitting element of the present invention shown by FIG. 3A has a light emitting laminated body including a first layer 101, a second layer 102, a third layer 103, a fourth layer 105, a sixth layer 107, and a seventh layer 108 between a first electrode 100 and a second electrode 104. FIG. 3A and FIG. 2A are different from each other in terms of a structure in which the sixth layer 107 is provided between the first layer 101 and the first electrode 100 and the seventh layer 108 is provided between the fourth layer 105 and the second electrode 104 in FIG. 3A. Such a structure may be used for the present invention.

Further, FIG. 3B and FIG. 2C are different from each other in terms of a structure in which the sixth layer 107 is provided between the first layer 101 and the first electrode 100 and the seventh layer 108 is provided between the fourth layer 105 and the second electrode 104 in FIG. 3B.

In FIGS. 3A and 3B, the first layer 101 is a layer having a high transporting property of carriers injected from the first electrode 100, and the fourth layer 105 is a layer having a high transporting property of carriers injected from the second electrode 104 (carrier transporting layer). The third layer 103 is a light emitting layer for obtaining desired light emission. The third layer 103, which is a light emitting layer, has a structure in which a material to be an emission center (emission center material) is dispersed in a host material. Further, the sixth layer 107 is a layer favorable for injection of carriers from the first electrode 100 and the seventh layer 108 is a layer favorable for injection of carriers from the second electrode 104 (carrier injecting layer).

In FIG. 3A, the second layer 102 has an energy gap larger than that of the first layer 101 and equal to or larger than that of the host material.

In FIG. 3B, the second layer 102 is made of a material which can transport carriers injected from the first electrode 100. The fifth layer 106 has an energy gap larger than that of the fourth layer 105 and equal to or larger than that of the host material. Further, the fifth layer 106 is made of a material which can transport carriers injected from the second electrode 104.

It is acceptable as long as each of the second layer 102 and the fifth layer 106 has a thickness of 0.1 nm or more and less than 5 nm, preferably 0.5 nm or more and 3 nm or less, and more preferably 1 nm or more and 2 nm or less. It is to be noted that an energy gap denotes an energy gap between a LUMO level and a HOMO level.

One or both of the sixth layer 107 and the seventh layer 108, which are carrier injecting layers, may be formed. By forming the layer, carriers are easily injected from the electrode to the light emitting laminated body and a drive voltage can be reduced.

In a case where light emission is obtained in applying a voltage of a certain level or more to the first electrode 100 of the light emitting element of the present invention having a structure shown in FIG. 3A so that a potential of the first electrode 100 is higher than that of the second electrode 104, carriers injected from the first electrode 100 are holes, and the sixth layer 107 serves as a hole injecting layer and is made of a material favorable for injection of holes. The first layer 101 serves as a hole transporting layer and is made of a material having a hole transporting property. Carriers injected from the second electrode 104 are electrons, and the seventh layer 108 serves as an electron injecting layer and is made of a material favorable for injection of electrons. In addition, the fourth layer serves as an electron transporting layer and is made of a material having a high electron transporting property.

The second layer 102 is made of a material which can transport holes. It is to be noted that a specific example of a material which can be used for the second layer 102 is the same as that in Embodiment Mode 1; therefore, the explanation will not be repeated.

In a case where light emission is obtained in applying a voltage of a certain level or more to the first electrode 100 so that a potential of the first electrode 100 is lower than that of the second electrode 104, carriers injected from the first electrode 100 are electrons, and the sixth layer 107 serves as an electron injecting layer and is made of a material favorable for injection of electrons. The first layer 101 serves as an electron transporting layer and is made of a material having a high electron transporting property. At this time, carriers injected from the second electrode 104 are holes, and the seventh layer 108 serves as a hole injecting layer and is made of a material favorable for injection of holes. The fourth layer 105 serves as a hole transporting layer and is made of a material having a high hole transporting property.

The second layer 102 is made of a material which can transport electrons. A specific example of a material which can be used for the second layer 102 is the same as that described in Embodiment Mode 1; therefore, the explanation will not be repeated.

In a case where light emission is obtained in applying a voltage of a certain level or more to the first electrode 100 of the light emitting element of the present invention having a structure shown in FIG. 3B so that a potential of the first electrode 100 is higher than that of the second electrode 104, carriers injected from the first electrode 100 are holes, and the sixth layer 107 serves as a hole injecting layer and is made of a material favorable for injection of holes. The first layer 101 serves as a hole transporting layer and is made of a material having a high hole transporting property. At this time, carriers injected from the second electrode 104 are electrons, and the seventh layer 108 serves as an electron injecting layer and is made of a material favorable for injection of electrons. The fourth layer serves as an electron transporting layer and is made of a material having an electron transporting property.

The second layer 102 is made of a material which can transport holes, and the fifth layer 106 is made of a material which can transport electrons. It is to be noted that a specific example of a material which can be used for the second layer 102 and the fifth layer 106 is the same as that described in Embodiment Mode 1; therefore, the explanation will not be repeated.

In a case where light emission is obtained in applying a voltage of a certain level or more to the first electrode 100 of the light emitting element of the present invention having a structure shown in FIG. 3B so that a potential of the first electrode 100 is lower than that of the second electrode 104, carriers injected from the first electrode 100 are electrons, and the sixth layer 107 serves as an electron injecting layer and is made of a material favorable for injection of electrons. The first layer 101 serves as an electron transporting layer and is made of a material having a high electron transporting property. At this time, carriers injected from the second electrode 104 are holes, and the seventh layer 108 serves as a hole injecting layer and is made of a material favorable for injection of holes. The fourth layer 105 serves as a hole transporting layer and is made of a material having a high hole transporting property.

The second layer 102 is made of a material which can transport electrons, and the fifth layer 106 is made of a material which can transport holes. It is to be noted that a specific example of a material which can be used for the second layer 102 and the fifth layer 106 is the same as that described in Embodiment Mode 1; therefore, the explanation will not be repeated.

In addition, a specific example of a material having a high hole transporting property or a material having a high electron transporting property used for the first layer 101 is also the same as that described in Embodiment Mode 1. It is to be noted that a material having a high hole transporting property or a material having a high electron transporting property used for the fourth layer 105 is the same as the material having a high hole transporting property or the material having a high electron transporting property given as the material for the first layer 101 in Embodiment Mode 1; therefore, refer to the description. A material having a high hole transporting property and a material having a high electron transporting property given as the material for the first layer 101 can be respectively used as a material favorable for injection of holes and a material favorable for injection of electrons, which can be used for the sixth layer 107 and the seventh layer 108. However, it is preferable to use a material having a comparatively high injection property of carriers than the first layer 101 and the fourth layer 105.

As another material favorable for injection of holes, metal oxide such as vanadium oxide, molybdenum oxide, ruthenium oxide, or aluminum oxide may be used. An adequate organic compound may be mixed into these oxides. Alternatively, when an organic compound is used, a porphyrin-based compound is effective, and phthalocyanine (abbreviation: $H_2$-Pc), copper phthalocyanine (abbreviation: Cu-Pc), or the like can be used. In addition, a material in which chemical doping is conducted to a conductive high molecular compound may be used, and polyethylene dioxythiophene (abbreviation: PEDOT) and polyaniline (abbreviation: PAni) doped with polystyrene sulfonate (abbreviation: PSS), or the like can be used.

As another material favorable for injection of electrons, alkaline earth metal salt such as calcium fluoride, alkali metal salt such as lithium fluoride, lithium oxide, or lithium chloride, or the like is preferable. Further, a layer to which a donor compound such as lithium is added to tris(8-quinolinolato) aluminum (abbreviation: $Alq_3$), bathocuproin (abbreviation: BCP), or the like can be used.

Although the second layer 102 and the fifth layer 106 are expressed as films in this specification, there is a possibility that each of the second layer 102 and the fifth layer 106 is too thin to be a complete film shape, and that each of the second layer 102 and the fifth layer 106 is formed in an island-like shape. Even in such a case, the structure of the present invention functions effectively. In the present invention, in a case of forming the second layer 102 and the fifth layer 106, a calibration curve of evaporation time against evaporation thickness is created under the same evaporation condition as a case of actually forming the second layer 102 and the fifth layer 106, and it is considered that the second layer 102 and the fifth layer 106 each having a specific thickness are formed by evaporation for a period required for a desired thickness on the calibration curve.

Here, in light emitting elements shown in FIGS. 3A and 3B, which are light emitting elements of the present invention, the second layer 102 is formed between the third layer 103, which is a light emitting layer, and the first layer 101, which is a carrier transporting layer. As described above, the second layer 102 has an energy gap larger than that of the first layer 101 and equal to or larger than that of the host material and is formed to have a thickness of 0.1 nm or more and less than 5 nm, preferably 0.5 nm or more and 3 nm or less, and more preferably 1 nm or more and 2 nm or less.

By providing such a second layer 102, even if an energy gap of the third layer 103 is larger than that of the first layer 101, movement of excitation energy from the third layer 103 to the first layer 101 can be effectively suppressed. As a result, a light emitting element with improved luminous efficiency can be obtained.

In addition, by providing the fifth layer 106, even if an energy gap of the third layer 103 is larger than that of the fourth layer 105, movement of excitation energy from the third layer 103 to the fourth layer 105 can be effectively suppressed. As a result, a light emitting element with improved luminous efficiency can be obtained.

Moreover, a light emitting element can be obtained, in which a drive voltage is hardly increased compared with a normal element in which one or both of the second layer 102 and the fifth layer 106 is/are not formed. In addition, a range of choice of a material which can be used for the first layer 101 and the fourth layer 105, which are carrier transporting layers, can be drastically widened because of the existence of the second layer 102 and the fifth layer 106.

It is to be noted that low carrier transporting properties of the second layer 102 and the fifth layer 106 are acceptable as long as the relation of energy gaps is satisfied and carriers can flow. Further, the second layer 102 and the fifth layer 106 are extremely thin. Therefore, a material, because of which reliability of a light emitting element itself becomes conventionally low owing to reliability of the material itself when the material is used for other layers, can be used as a material for the second layer 102 and the fifth layer 106 without reduction in reliability of a light emitting element. This is one of great features of the present invention.

According to the light emitting element of the present invention, by including one or both of such a second layer 102 and a fifth layer 106, movement of excitation energy from the third layer 103 to the first layer 101, or from the third layer 103 to the fourth layer 105, or both is suppressed and an emission center material can emit light effectively in a light emitting layer, thereby improving luminous efficiency. By the improvement of luminous efficiency, the same luminance can be obtained with a smaller amount of current than a conventional amount, and deterioration of a light emitting element is suppressed. Thus, a light emitting element with improved reliability can be obtained.

In addition, a drive voltage can also be reduced. It is to be noted that, in the light emitting element of the present invention, the second layer 102 and the fifth layer 106 are extremely thin; therefore, increase in a drive voltage due to the formation of the second layer 102 or the fifth layer 106, or both is not caused. Accordingly, an effect of reducing a drive voltage accompanied with the improvement of luminous efficiency becomes further remarkable.

An electrode through which light is to be extracted, which is the first electrode 100 or the second electrode 104, is made of a conductive material having a light transmitting property. At this time, the other electrode is made of a material having high reflectance, and thus, light emission can be extracted effectively. Further, when both of the electrodes are made of a conductive material having a light transmitting property, light can be extracted from both sides of a light emitting element.

It is to be noted that a conductive material having a high work function (work function of 4.0 eV or more) is desirably used for an electrode to which a high voltage is applied in obtaining light emission from the third layer 103, which is a light emitting layer, and a conductive material having a low work function (work function of 3.8 eV or less) is desirably used for an electrode to which a low voltage is applied in obtaining light emission. However, by providing a material favorable for an injecting property of carriers to be in contact with the electrode to which a low voltage is applied, a conductive material can be used for the electrode regardless of its work function. A specific material for these electrodes is the same as that described in Embodiment Mode 1; therefore, the explanation will not be repeated.

Further, the emission center substance and the host material are also the same as that described in Embodiment Mode 1.

The matter other than that explained in this embodiment mode is the same as Embodiment Mode 1, and refer to the explanation in Embodiment Mode 1.

The sixth layer 107 or the seventh layer 108 can be applied to another structure of the present invention in combination with Embodiment Modes 1 to 5.

Embodiment Mode 7

A light emitting device of the present invention and a method for manufacturing thereof will be explained in this embodiment mode with reference to FIGS. 4A to 4E and FIGS. 5A to 5C. In this embodiment mode, an example of manufacturing an active matrix light emitting device will be described. However, as a matter of course, the present invention can also be applied to a passive light emitting device.

After forming a first base insulating layer 51a and a second base insulating layer 51b over a substrate 50, a semiconductor layer is formed over the second base insulating layer 51b.

As a material for the substrate 50, glass, quartz, plastic (such as polyimide, acrylic, polyethylene terephthalate, polycarbonate, polyacrylate, and polyether sulfone), or the like can be used. A substrate made of such a material may be used after being polished with CMP or the like if necessary. In this embodiment mode, a glass substrate is used.

The first base insulating layer 51a and the second base insulating layer 51b are provided to prevent an element which adversely affects characteristics of the semiconductor film such as alkali metal and alkali earth metal from dispersing into the semiconductor film. As a material for the first base insulating layer 51a and the second base insulating layer 51b, silicon oxide, silicon nitride, silicon oxide containing nitrogen, silicon nitride containing oxygen, and the like can be used. In this embodiment mode, the first base insulating layer 51a is formed using silicon nitride and the second base insulating layer 51b is formed using silicon oxide. Although a base insulating film is formed to be two layers including the first base insulating layer 51a and the second base insulating layer 51b in this embodiment mode, the base insulating film may be formed to be a single layer or two or more layers. In addition, when dispersion of an impurity from the substrate causes no problems, these base insulating layers are not necessary to be provided.

The semiconductor layer, which is formed after the formation of the first and second base insulating layers, is obtained by crystallizing an amorphous silicon film by laser. Specifically, an amorphous silicon film is formed over the second base insulating layer 51b to have a thickness of 25 to 100 nm (preferably, 30 to 60 nm). As a method for forming the amorphous silicon film, a known method such as a sputtering method, a reduced pressure CVD method, or a plasma CVD method can be used. Thereafter, heat treatment is performed at 500° C. for 1 hour to perform dehydrogenation.

Subsequently, the amorphous silicon film is crystallized using a laser irradiation apparatus to form a crystalline silicon film. In the laser crystallization of this embodiment mode, an excimer laser is used, and laser beam oscillated from the excimer laser is processed into a linear beam spot using an optical system. Then, the amorphous silicon film is irradiated with the linear beam spot so as to obtain the crystalline silicon film. This crystalline silicon film is used as the semiconductor layer.

As another method for crystallizing an amorphous silicon film, there are a crystallization method only using heat treatment, a method performing heat treatment by using a catalytic element for accelerating crystallization, and the like. As an element for accelerating crystallization, nickel, iron, palladium, tin, lead, cobalt, platinum, copper, gold, and the like can be given. As compared to a case where crystallization is performed only by heat treatment, when crystallization is performed using such an element for accelerating crystallization, crystallization is performed at lower temperature for shorter time, which results in less damage to a glass substrate and the like. When crystallization is performed only by heat treatment, a quartz substrate, which is resistant to heat, or the like may be used as the substrate 50.

Next, in order to control a threshold value, a minute amount of an impurity is added to the semiconductor layer, if necessary. That is, channel doping is performed. To obtain a required threshold value, an impurity (such as phosphorus and boron) having an n-type conductivity or a p-type conductivity is added to the semiconductor layer by ion doping or the like.

Thereafter, the semiconductor layer is patterned into a predetermined shape to obtain an island-like semiconductor layer 52. The semiconductor layer is formed in the following manner: a photoresist is applied to the semiconductor layer, a predetermined shape is exposed, baking and developing are performed to form a resist mask over the semiconductor layer, and the semiconductor layer is etched using the resist mask.

Subsequently, a gate insulating layer 53 is formed to cover the semiconductor layer 52. The gate insulating layer 53 is formed using an insulating layer containing silicon to have a thickness of 40 to 150 nm by a plasma CVD method or a sputtering method. In this embodiment mode, the gate insulating layer 53 is formed using silicon oxide.

A gate electrode 54 is formed over the gate insulating layer 53. The gate electrode 54 is formed using an element selected from tantalum, tungsten, titanium, molybdenum, aluminum, copper, chromium, and niobium; or an alloy material or a compound material containing the above mentioned element as its main component. Further, a semiconductor film typified by a polycrystalline silicon film doped with an impurity element such as phosphorus may be used. In addition, an AgPdCu alloy may be used.

Although the gate electrode 54 is formed to be a single layer in this embodiment mode, the gate electrode 54 may be formed to have a laminated structure including two or more layers such as a lower layer made of tungsten and an upper layer made of molybdenum. When the gate electrode is formed to have a laminated structure, the above mentioned materials may be used. Further, a combination of the above mentioned materials may arbitrarily be selected. The gate electrode 54 is etched utilizing a mask made of a photoresist.

Subsequently, a high concentration impurity is added to the semiconductor layer 52 while utilizing the gate electrode 54 as a mask. Thus, a thin film transistor 70 including the semiconductor layer 52, the gate insulating layer 53, and the gate electrode 54 is formed.

Further, the steps of manufacturing the thin film transistor are not particularly limited, and the steps thereof may arbitrarily be changed to obtain a thin film transistor with a desired structure.

A top-gate type thin film transistor using the crystalline silicon film, which is crystallized by using laser crystallization, is formed in this embodiment mode. Alternatively, a bottom-gate type thin film transistor using an amorphous semiconductor film can be used for a pixel portion. The amorphous semiconductor film can use not only silicon but also silicon germanium. When using silicon germanium, the concentration of germanium is preferably set to be about 0.01 to 4.5 atomic %.

Then, an impurity element is added to the semiconductor layer 52 while utilizing the gate electrode 54 as a mask. An impurity element is an element which can impart one conductivity type to the semiconductor layer 52. Phosphorus can be typically given as an impurity element imparting n-type conductivity; and boron or the like, as an impurity element imparting p-type conductivity. However, it is desirable to select an impurity element so as to be p-type in a case where a first electrode of the light emitting element is made to serve as an anode, and it is desirable to select an impurity element so as to be n-type in a case where a first electrode of the light emitting element is made to serve as a cathode.

Figure 4A:
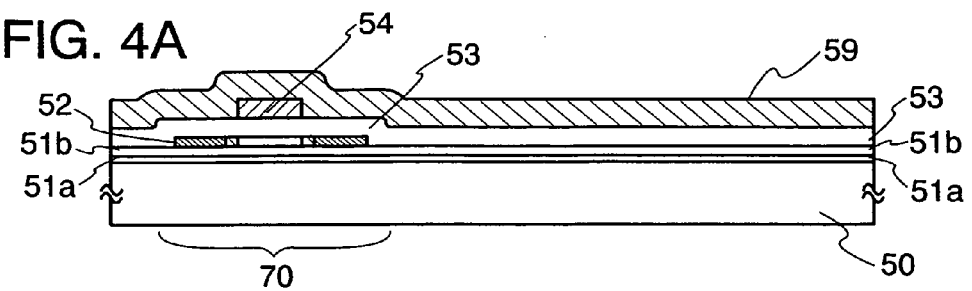
FIGS. 4A to 4E are explanatory cross-sectional views of a manufacturing method of an active matrix light emitting device of the present invention.

Subsequently, an insulating film (hydrogenated film) 59 is formed by using silicon nitride so as to cover the gate electrode 54 and the gate insulating layer 53. The insulating film (hydrogenated film) 59 is heated at 480° C. for about 1 hour to activate the impurity element and hydrogenate the semiconductor layer 52 (FIG. 4A).

Figure 4B:
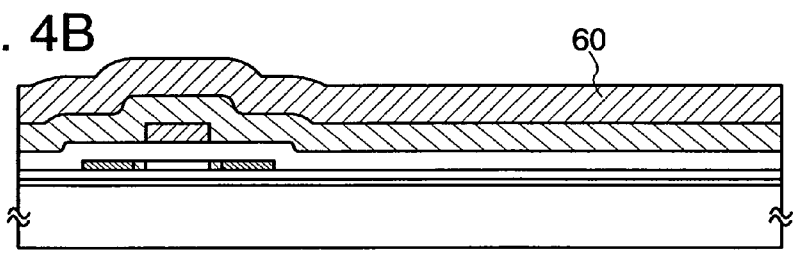

Subsequently, a first interlayer insulating layer 60 is formed to cover the insulating film (hydrogenated film) 59. As a material for forming the first interlayer insulating layer 60, silicon oxide, acrylic, polyimide, a Low-k material, and the like may be used. In addition, a material, which is composed of a skeleton formed by the bond of silicon (Si) and oxygen (O) and includes, as the substituent, an organic group containing at least hydrogen (such as an alkyl group or an aryl group), a fluoro group, or a fluoro group and an organic group containing at least hydrogen can also be used. The material is referred to as so-called siloxane. In this embodiment mode, a silicon oxide film is formed as the first interlayer insulating layer (FIG. 4B).

Figure 4C:
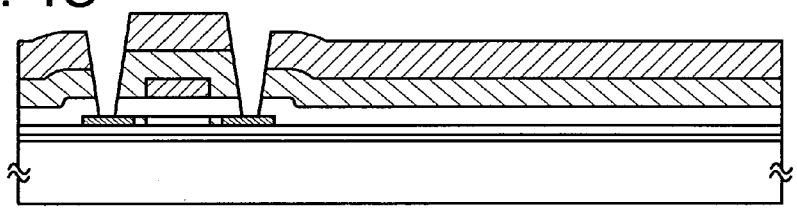

Next, contact holes that reach the semiconductor layer 52 are formed. The contact holes can be formed by etching to expose the semiconductor layer 52 using a resist mask. The contact holes can be formed by either wet etching or dry etching. Further, they may be formed by etching one or more times depending on a condition. When etching is performed plural times, both wet etching and dry etching may be used (FIG. 4C).

Figure 4D:
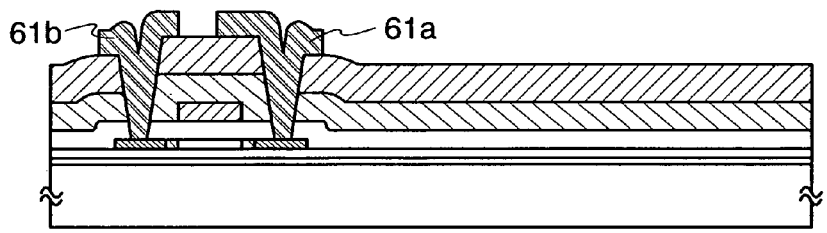

A conductive layer is formed to cover the contact holes and the first interlayer insulating layer 60. This conductive layer is processed into a desired shape to form a connection portion 61*a*, a wiring 61*b*, and the like. This wiring may have a single layer made of aluminum, copper, an aluminum-carbon-nickel alloy, an aluminum-carbon-molybdenum alloy, or the like. Further, the wiring may have a structure formed by laminating molybdenum, aluminum, and molybdenum from a substrate side, a structure formed by laminating titanium, aluminum, and titanium from the substrate side, or a structure formed by laminating titanium, titanium nitride, aluminum, and titanium from the substrate side (FIG. 4D).

Figure 4E:
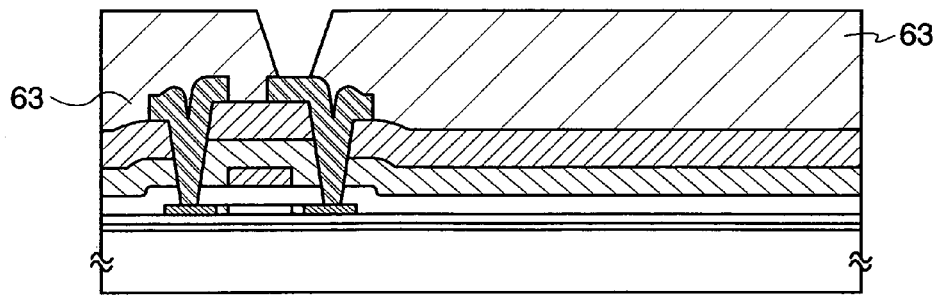

Thereafter, a second interlayer insulating layer 63 is formed to cover the connection portion 61*a*, the wiring 61*b*, and the first interlayer insulating layer 60. As a material for the second interlayer insulating layer 63, a film formed by application of acrylic, polyimide, siloxane, or the like having a self-planarizing property is preferably used. In this embodiment mode, siloxane is used to form the second interlayer insulating layer 63 (FIG. 4E).

Subsequently, an insulating layer may be formed using silicon nitride or the like over the second interlayer insulating layer 63. This insulating layer is formed to prevent the second interlayer insulating layer 63 from being etched more than necessary in etching a pixel electrode that will be formed later. Therefore, when the ratio of the etching rate between the pixel electrode and the second interlayer insulating layer is large, this insulating layer may not be provided. Next, a contact hole is formed through the second interlayer insulating layer 63 to reach the connection portion 61*a*.

A conductive layer having a light transmitting property is formed to cover the contact hole and the second interlayer insulating layer 63 (or the insulating layer). Thereafter, the conductive layer having a light transmitting property is processed to form a first electrode 64 of a thin-film light emitting element. Here, the first electrode 64 is electrically connected to the connection portion 61*a*.

The first electrode 64 can be made of metal having conductivity such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy thereof such as an aluminum-silicon (Al—Si) alloy, an aluminum-titanium (Al—Ti) alloy, or an aluminum-silicon-copper (Al—Si—Cu) alloy; nitride of a metal material such as titanium nitride (TiN); a metal compound such as indium tin oxide (ITO), ITO containing silicon, or an object formed by using a target in which 2 to 20 wt % zinc oxide (ZnO) is mixed into indium oxide (in this specification, referred to as IZO (indium zinc oxide)); or the like.

Figure 5A:
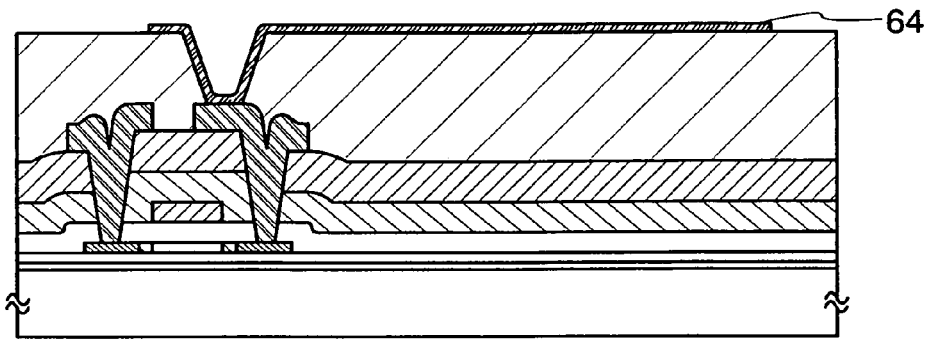
FIGS. 5A to 5C are explanatory cross-sectional views of a manufacturing method of an active matrix light emitting device of the present invention.

An electrode through which light is extracted may be formed using a conductive film with transparency. For example, a metal compound such as indium tin oxide (ITO), indium tin oxide containing silicon oxide, or an object formed by using a target in which 2 to 20 wt % zinc oxide (ZnO) is mixed into indium oxide (in this specification, referred to as IZO (indium zinc oxide)) is used. In addition, an extremely thin film of metal such as Al and Ag is used. Further, in a case where light emission is extracted through a second electrode, the first electrode can be made of a material having high reflectance (such as Al and Ag). In this embodiment mode, ITSO is used to form the first electrode 64 (FIG. 5A).

Figure 5B:
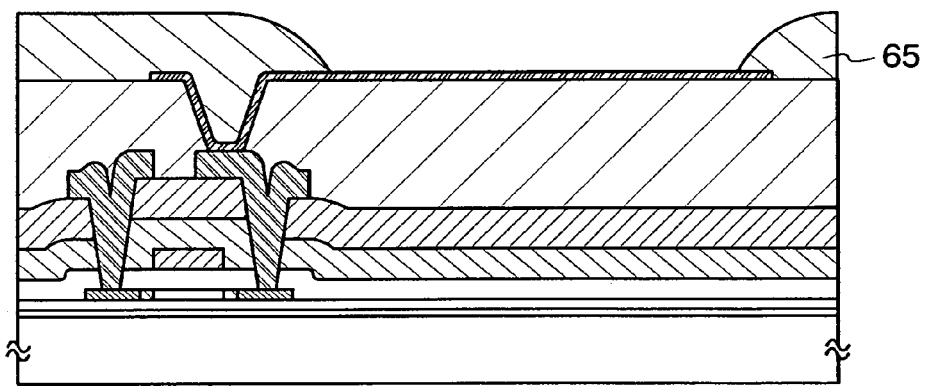
Figure 5C:
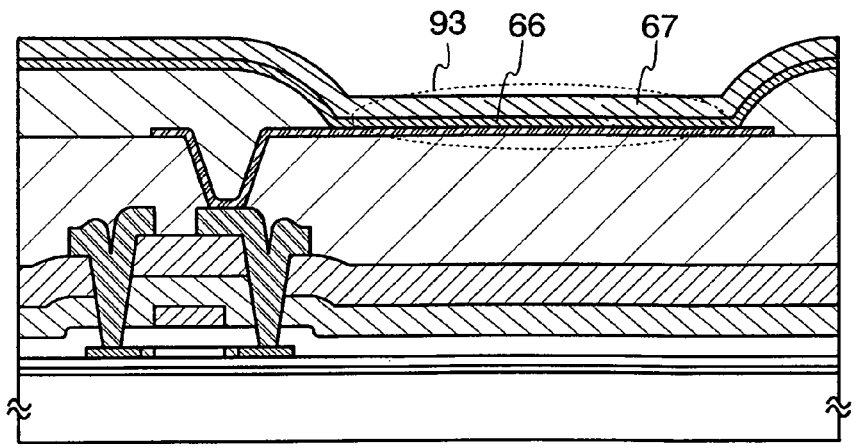

Next, an insulating layer is formed using an organic material or an inorganic material to cover the second interlayer insulating layer 63 (or the insulating layer) and the first electrode 64. Subsequently, the insulating layer is processed to expose a part of the first electrode 64 so as to form a partition wall 65. A photosensitive organic material (such as acrylic and polyimide) is preferably used as a material for the partition wall 65. In addition, the partition wall may be formed using a nonphotosensitive organic or inorganic material. Further, a black pigment or dye such as carbon nitride or black titanium oxide may be dispersed in a material for the partition wall 65 by using a dispersant or the like so that the partition wall 65 may be used as a black matrix. Preferably, an edge surface of the partition wall 65, which faces the first electrode, has a tapered shape such that the curvature is continuously varied (FIG. 5B).

Next, a light emitting laminated body 66 is formed, and subsequently, a second electrode 67 covering the light emitting laminated body 66 is formed. Thus, a light emitting element 93 in which the light emitting laminated body 66 is interposed between the first electrode 64 and the second electrode 67 can be manufactured, and light emission can be obtained by applying a voltage, which is higher than the second electrode, to the first electrode. As an electrode material used for forming the second electrode 67, the material which is the same as that of the first electrode can be used. In this embodiment mode, aluminum is used for the second electrode.

The light emitting laminated body 66 may be formed by a known method such as an evaporation method, an ink-jet method, a spin coating method, a dip coating method, or the like. The light emitting laminated body 66 has a structure as described in Embodiment Modes 1 to 6. As a material used for the light emitting laminated body, a single layer or a laminated layer of an organic compound is used in many cases; however, a structure is also included in the present invention, in which an inorganic compound is used in part of a film made of an organic compound.

Afterwards, a silicon oxide film containing nitrogen is formed as a passivation film by a plasma CVD method. When using a silicon oxide film containing nitrogen, a silicon oxynitride film may be formed using $SiH_4$, $N_2O$, and $NH_3$ by a plasma CVD method, or a silicon oxynitride film may be formed using SiH and $N_2O$ by a plasma CVD method, or a silicon oxynitride film may be formed using a gas in which $SiH_4$ and $N_2O$ are diluted with Ar, by a plasma CVD method.

Alternatively, as the passivation film, a hydrogenated silicon oxynitride film formed using $SiH_4$, $N_2O$, and $H_2$ may be used. The passivation film is, of course, not limited to a single layer structure, and it may have a single layer structure or a laminated structure of other insulating layer containing silicon. In addition, a multilayer film including a carbon nitride film and a silicon nitride film, a multilayer film including styrene polymer, a silicon nitride film, or a diamond like carbon film may be formed instead of the silicon oxide film containing nitrogen.

Subsequently, to protect the light emitting element from a substance which promotes deterioration of the light emitting element such as water, a display portion is sealed. When the display portion is sealed with a counter substrate, the counter substrate is attached to the display portion with an insulating sealing material such that an external connection portion is exposed. A space between the counter substrate and the element substrate may be filled with an inert gas such as dried nitrogen. Alternatively, a sealing material may be applied over the entire surface of the pixel portion and then the counter substrate may be attached thereto. An ultraviolet curing resin or the like is preferably used as the sealing material. A drying agent or a particle for maintaining a constant gap between the substrates may be mixed in the sealing material. Subsequently, a flexible wiring substrate is attached to the external connection portion. Thus, a light emitting device is completed.

Examples of structures of a light emitting device manufactured above will be explained with reference to FIGS. 6A and 6B. Further, portions having similar functions are denoted by same reference numerals, though they may have different shapes, so as to omit explanation. In this embodiment mode, the thin film transistor 70 having an LDD structure is connected to the light emitting element 93 through the connection portion 61a.

Figure 6A:
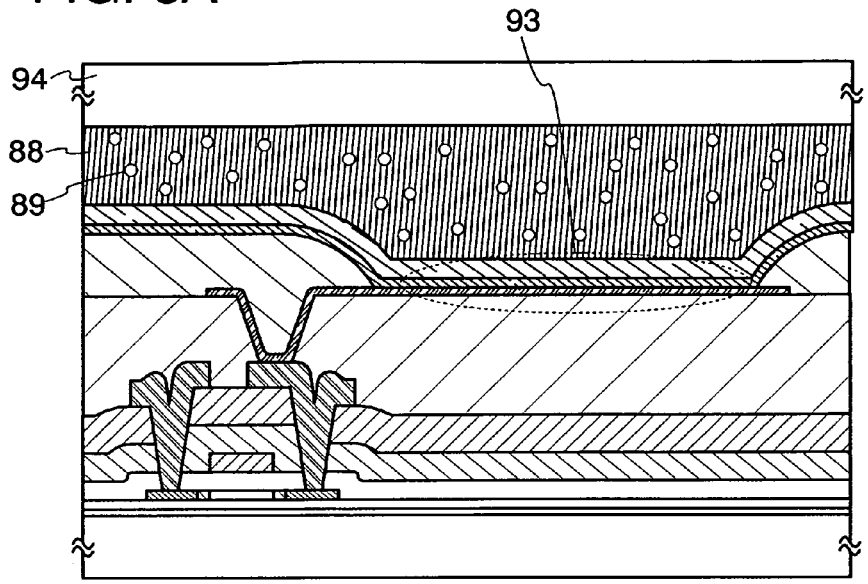
FIGS. 6A and 6B are cross-sectional views of a light emitting device of the present invention.

FIG. 6A shows a structure in which the first electrode 64 is made of a conductive film having a light transmitting property, and light generated in the light emitting laminated body 66 is emitted toward the substrate 50 side. Further, reference numeral 94 denotes a counter substrate. After forming the light emitting element 93 over the counter substrate 94, the counter substrate is firmly attached to the substrate 50 using a sealing material or the like. A space between the counter substrate 94 and the light emitting element is filled with a resin 88 or the like having a light transmitting property to seal the light emitting element. Accordingly, the light emitting element 93 can be prevented from being deteriorated by moisture. Preferably, the resin 88 desirably has a hygroscopic property. More desirably, to prevent the influence of moisture, a drying agent 89 with a high light transmitting property is dispersed in the resin 88.

Figure 6B:
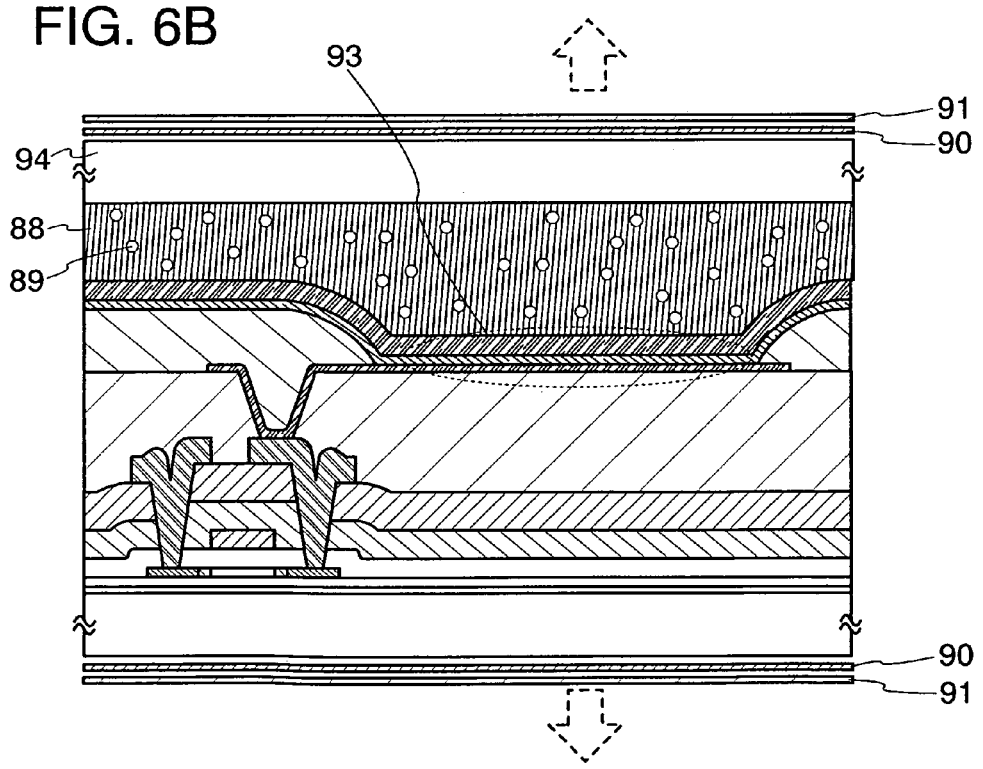

FIG. 6B shows a structure in which both of the first electrode 64 and the second electrode 67 are made of conductive films having light transmitting properties and light can be extracted toward both of the substrate 50 and the counter substrate 94. In this structure, by providing polarizing plates 90 outside the substrate 50 and the counter substrate 94, a screen can be prevented from being transparent, thereby improving visibility. Protection films 91 may be provided outside the polarizing plates 90.

A light emitting device having a display function in accordance with the present invention may employ either an analog video signal or a digital video signal. When a digital video signal is used, the video signal may use either a voltage or a current. When the light emitting element emits light, a video signal input to a pixel may have either a constant voltage or a constant current. When a video signal has a constant voltage, a constant voltage is applied to a light emitting element or a constant current flows through the light emitting element. Also, when a video signal has a constant current, a constant voltage is applied to a light emitting element or a constant current flows through the light emitting element. A driving method where a constant voltage is applied to a light emitting element is called a constant voltage drive. Meanwhile, a driving method where a constant current flows through a light emitting element is called a constant current drive. According to the constant current drive, constant current flows regardless of changes in resistance of a light emitting element. Any method described above may be used for the light emitting device of the present invention and a driving method thereof.

The light emitting device of the present invention having such a structure is a light emitting device with high reliability. Further, the light emitting device of the present invention having such a structure is a light emitting device consuming low power.

Embodiment Mode 8

Figure 7A:
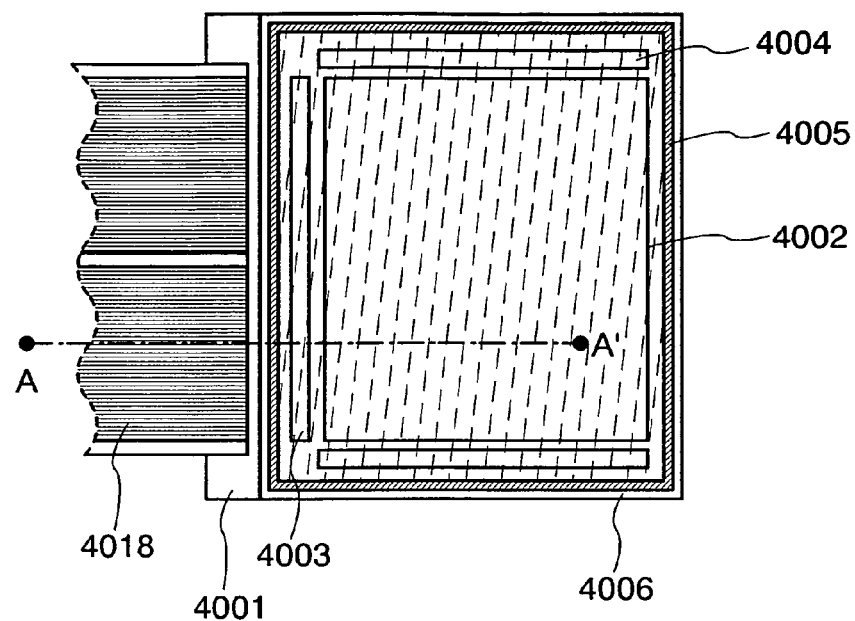
FIGS. 7A and 7B each are a top view and a cross-sectional view of a light emitting device of the present invention.
Figure 7B:
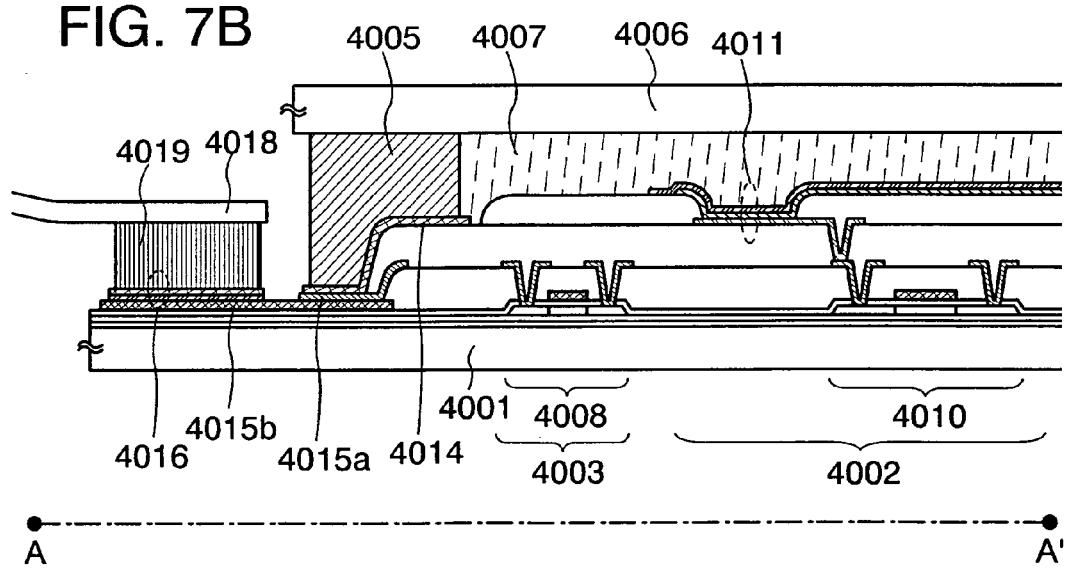

In this embodiment mode, an outer appearance of a panel, which is a light emitting device of the present invention, will be explained with reference to FIGS. 7A and 7B. FIG. 7A is a top view of a panel in which a transistor and a light emitting element formed over a substrate are sealed with a sealing material that is formed between the substrate and a counter substrate 4006. FIG. 7B is a cross-sectional view taken along line A-A' of FIG. 7A. The light emitting element mounted on this panel has a structure as shown in Embodiment Mode 2.

A sealing material 4005 is provided so as to surround a pixel portion 4002, a signal line driver circuit 4003, and a scanning line driver circuit 4004 which are provided over a substrate 4001. The counter substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are hermetically sealed with the substrate 4001, the sealing material 4005, and the counter substrate 4006 along with a filler 4007.

The pixel portion 4002, the signal line driver circuit 4003, and the scanning line driver circuit 4004, which are provided over the substrate 4001, have a plurality of thin film transistors. In FIG. 7B, a thin film transistor 4008 included in the signal line driver circuit 4003 and a thin film transistor 4010 included in the pixel portion 4002 are shown.

Further, a light emitting element 4011 is electrically connected to the thin film transistor 4010.

Also, a leading wiring 4014 corresponds to a wiring for supplying signals or power supply voltage to the pixel portion 4002, the signal line driver circuit 4003, and the scanning line driver circuit 4004. The leading wiring 4014 is connected to a connection terminal 4016 through leading wirings 4015a and 4015b. The connection terminal 4016 is electrically connected to a terminal included in a flexible printed circuit (FPC) 4018 through an anisotropic conductive film 4019.

Further, as the filler 4007, an ultraviolet curing resin or a heat curing resin can be used in addition to an inert gas such as nitrogen and argon. For example, polyvinyl chloride, acrylic, polyimide, an epoxy resin, a silicon resin, polyvinyl butyral, or ethylene vinylene acetate can be used.

Furthermore, the light emitting device of the present invention includes a panel in which a pixel portion having a light emitting element is formed and a module in which an IC is mounted on the panel.

The light emitting device of the present invention having the structure described above is a light emitting device with high reliability of a pixel portion because a light emitting element described in any of Embodiment Modes 1 to 6 is included as a light emitting element included in the pixel portion. Further, the light emitting device of the present invention is a light emitting device consuming low power because a light emitting element described in any of Embodiment Modes 1 to 6 is included as a light emitting element included in the pixel portion.

This embodiment mode can be implemented by being freely combined with an appropriate structure of Embodiment Modes 1 to 7.

Embodiment Mode 9

In this embodiment mode, a pixel circuit and a protection circuit included in the panel and module described in Embodiment Mode 8, and operation thereof will be explained. Further, the cross-sectional-views shown in FIGS. 4A to 4E and FIGS. 5A to 5C correspond to cross-sectional views of a driving TFT 1403 and a light emitting element 1405.

Figure 8A:
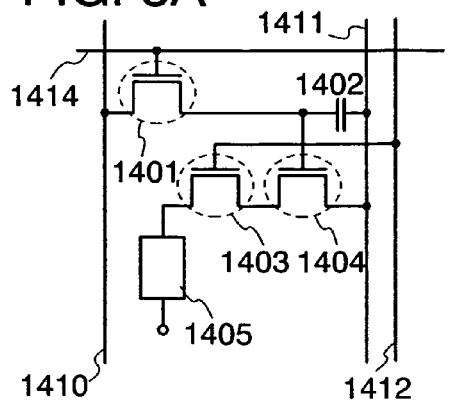
FIGS. 8A to 8F are diagrams each showing one example of a pixel circuit of a light emitting device of the present invention.

In a pixel shown in FIG. 8A, a signal line 1410, power supply lines 1411 and 1412 are arranged in a column direction, whereas a scanning line 1414 is arranged in a row direction. The pixel also includes a switching TFT 1401, a driving TFT 1403, a current controlling TFT 1404, a capacitor element 1402, and a light emitting element 1405.

Figure 8B:
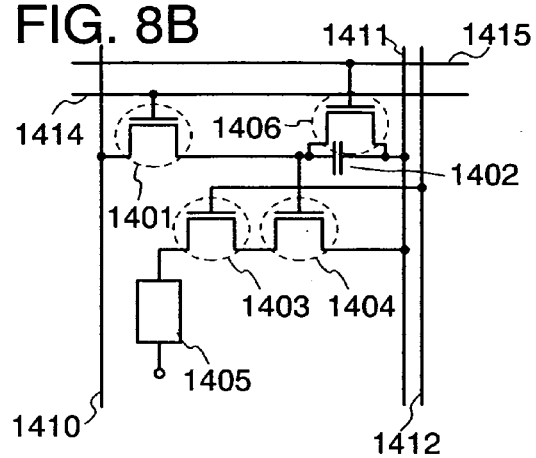
Figure 8C:
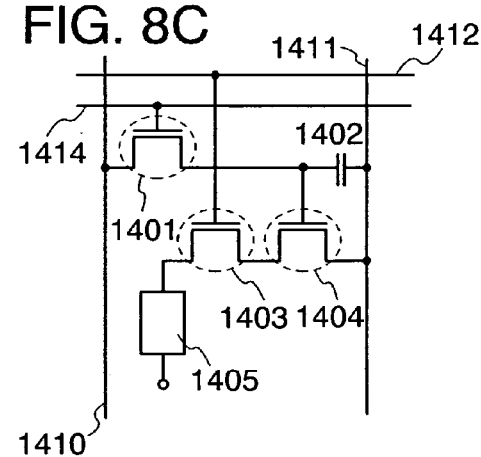
Figure 8D:
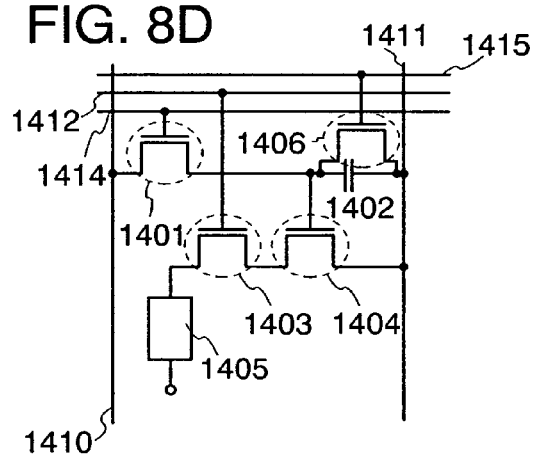

A pixel shown in FIG. 8C has a similar structure to the pixel shown in FIG. 8A, except that a gate electrode of the driving TFT 1403 is connected to a power supply line 1412 that is arranged in a row direction. That is, the equivalents circuit of each pixel shown in FIGS. 8A and 8C are the same. However, respective power supply lines are made of conductive films in different layers between the case where the power supply line 1412 is arranged in a column direction (FIG. 8A) and the case where the power supply line 1412 is arranged in a row direction (FIG. 8C). Here, a wiring connected to the gate electrode of the driving TFT 1403 is focused and the figures are separately shown in FIGS. 8A and 8C in order to show that the wiring is formed in different layer.

In each pixel shown in FIGS. 8A and 8C, the driving TFT 1403 and the current controlling TFT 1404 are connected in series, and the channel length L(1403) and the channel width W(1403) of the driving TFT 1403 and the channel length L(1404) and the channel width W(1404) of the current controlling TFT 1404 may be set to satisfy the relation of L(1403)/W(1403):L(1404)/W(1404)=5,000:1 to 6,000:1.

The driving TFT 1403 is operated in a saturation region and controls the amount of current flowing through the light emitting element 1405, whereas the current controlling TFT 1404 is operated in a linear region and controls current supplied to the light emitting element 1405. Both of the TFTs 1403 and 1404 preferably have the same conductivity type in view of the manufacturing process, and n-channel TFTs are formed as the TFTs 1403 and 1404 in this embodiment mode. Also, a depletion type TFT may be used as the driving TFT 1403 instead of an enhancement type TFT. In a light emitting device of the present invention having the above structure, slight variations in Vgs of the current controlling TFT 1404 does not affect the amount of current flowing through the light emitting element 1405, since the current controlling TFT 1404 is operated in the linear region. That is, the amount of current flowing through the light emitting element 1405 can be determined by the driving TFT 1403 operated in the saturation region. In accordance with the above described structure, it is possible to provide a light emitting device in which image quality is improved by improving variations in luminance of a light emitting element due to variation of the TFT characteristics.

The switching TFT 1401 in each pixel shown in FIGS. 8A to 8D controls a video signal input with respect to the pixel. When the switching TFT 1401 is turned on and a video signal is inputted in the pixel, a voltage of the video signal is held in the capacitor element 1402. Although the arrangement in which each pixel includes the capacitor element 1402 is shown in FIGS. 8A and 8C, the present invention is not limited thereto. When a gate capacitor or the like can function as a capacitor for holding a video signal, the capacitor element 1402 may not be provided.

A pixel shown in FIG. 8B has a similar structure to the pixel structure shown in FIG. 8A, except that a TFT 1406 and a scanning line 1415 are added thereto. Similarly, a pixel shown in FIG. 8D has a similar structure to the pixel structure shown in FIG. 8C, except that a TFT 1406 and a scanning line 1415 are added thereto.

The TFT 1406 is controlled to be turned on/off by the newly provided scanning line 1415. When the TFT 1406 is turned on, the charge held in the capacitor element 1402 is discharged, thereby turning the current controlling TFT 1404 off. That is, supply of current flowing through the light emitting element 1405 can be forcibly stopped by providing the TFT 1406. Therefore, the TFT 1406 can be referred to as an erasing TFT. In accordance with the structures shown in FIGS. 8B and 8D, a lighting period can start concurrently with or immediately after a start of a writing period before signals are written into all the pixels, and hence, the duty ratio can be improved.

Figure 8E:
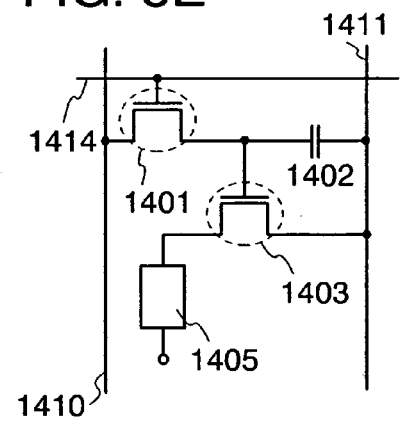
Figure 8F:
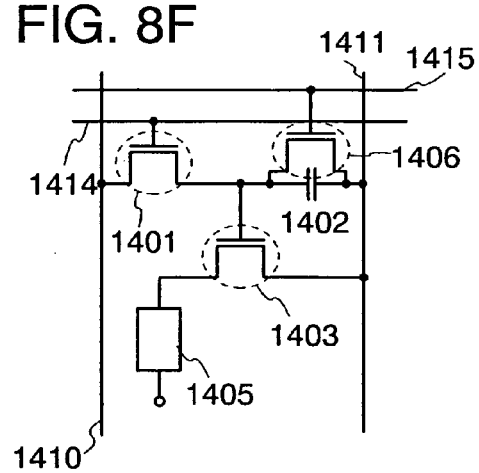

In a pixel shown in FIG. 8E, a signal line 1410 and a power supply line 1411 are arranged in a column direction while a scanning line 1414 is arranged in a row direction. The pixel further includes a switching TFT 1401, a driving TFT 1403, a capacitor element 1402, and a light emitting element 1405. A pixel shown in FIG. 8F has a similar structure to the pixel structure shown in FIG. 8E, except that a TFT 1406 and a scanning line 1415 are added thereto. Further, the structure as shown in FIG. 8F also allows a duty ratio to be improved by providing the TFT 1406.

Figure 9:
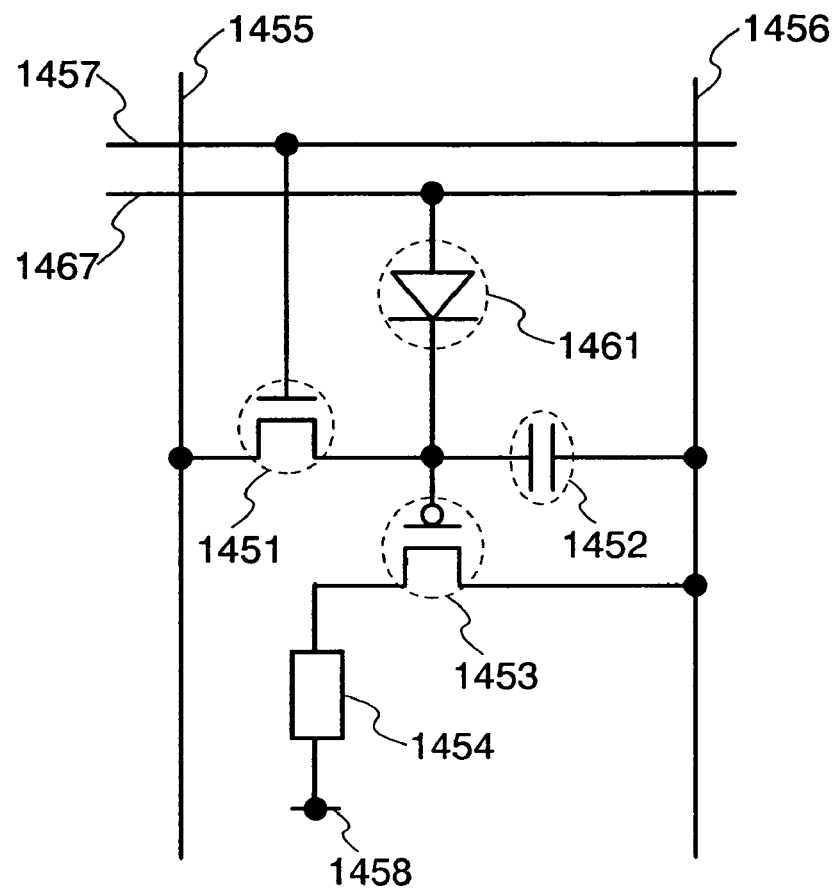
FIG. 9 is a diagram showing one example of a pixel circuit of a light emitting device of the present invention.

A structural example of a pixel in a case where the driving TFT 1403 is forcibly turned off will be shown in FIG. 9. In FIG. 9, a selecting TFT 1451, a driving TFT 1453, an erasing diode 1461, and a light emitting element 1454 are arranged. A source and a drain of the selecting TFT 1451 are connected to a signal line 1455 and a gate of the driving TFT 1453, respectively. A gate of the selecting TFT 1451 is connected to a first gate line 1457. A source and a drain of the driving TFT 1453 are connected to a first power supply line 1456 and the light emitting element 1454, respectively. The erasing diode 1461 is connected to a gate of the driving TFT 1453 and a second gate line 1467.

A capacitor element 1452 serves to hold a gate potential of the driving TFT 1453. Therefore, the capacitor element 1452 is connected between the gate of the driving TFT 1453 and the power supply line 1456. However, the present invention is not limited to this structure, and the capacitor element may be arranged such that it can hold a gate potential of the driving TFT 1453. Further, when a gate potential of the driving TFT 1453 can be held by using a gate capacitor of the driving TFT 1453, the capacitor element 1452 may be eliminated.

As the driving method, the first gate line 1457 is selected and the selecting TFT 1451 is turned on. When a signal is inputted in the capacitor element 1452 from the signal line 1455, current of the driving TFT 1453 is controlled in accordance with the signal, and current flows into a second power supply line 1458 through the light emitting element 1454 from the first power supply line 1456.

In order to erase a signal, the second gate line 1467 is selected (in this case, a potential is increased), and the erasing diode 1461 is turned on so as to feed current to the gate of the driving TFT 1453 from the second gate line 1467. As a result, the driving TFT 1453 becomes an off state. Thus, current does not flow into the second power supply line 1458 from the first power supply line 1456 through the light emitting element 1454. Consequently, a non-light emitting period can be made, thereby freely adjusting the length of a light emitting period.

In order to hold a signal, the second gate line 1467 is not selected (in this case, a potential is reduced). Thus, the erasing diode 1461 is turned off so that a gate potential of the driving TFT 1453 is held.

Further, the erasing diode 1461 is not particularly limited as long as it is an element having a rectifying property. Either a PN-type diode or a PIN-type diode may be used. Alternatively, either a Schottky diode or a zener diode may be used.

As described above, various kinds of pixel circuits can be employed. In particular, when a thin film transistor is formed using an amorphous semiconductor film, an area of a semiconductor film of the driving TFT 1403 is preferably made large. Therefore, in the above pixel circuits, a top emission type in which light generated in the light emitting laminated body is emitted through a sealing substrate is preferably employed.

It is thought that such an active matrix light emitting device is favorable when pixel density is increased since a TFT is provided for each pixel and driving with a low drive voltage can be conducted.

An active matrix light emitting device in which each TFT is provided in a pixel is explained in this embodiment mode. However, a passive matrix light emitting device can be formed. Since a TFT is not provided in each pixel in the passive matrix light emitting device, high aperture ratio is obtained. In a case of a light emitting device in which light is emitted toward both sides of the light emitting laminated body, when a passive matrix light emitting device is employed, transmittance can be increased.

Subsequently, a case in which diodes are provided as protection circuits in a scanning line and a signal line, will be explained using an equivalent circuit diagram shown in FIG. 8E.

Figure 10:
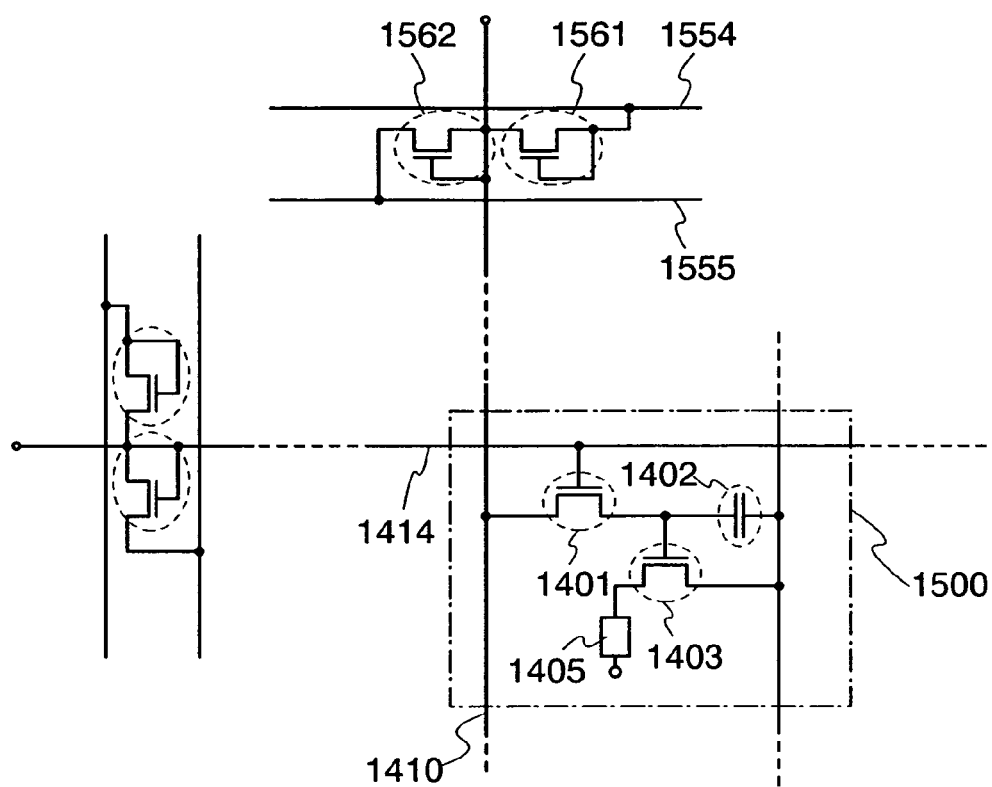
FIG. 10 is a diagram showing one example of a protection circuit of a light emitting device of the present invention.

In FIG. 10, switching TFTs 1401 and 1403, a capacitor element 1402, and a light emitting element 1405 are provided in a pixel portion 1500. In a signal line 1410, diodes 1561 and 1562 are provided. The diodes 1561 and 1562 are manufactured in accordance with the above described embodiment mode in the same manner as the switching TFTs 1401 and 1403. Each diode includes a gate electrode, a semiconductor layer, a source electrode, a drain electrode, and the like. By connecting the gate electrode to the drain electrode or the source electrode, the diodes 1561 and 1562 are operated.

Common potential lines 1554 and 1555 connected to the diodes are formed in the same layer as the gate electrodes. Therefore, it is necessary to form contact holes in a gate insulating layer so as to be connected to the source electrodes or the drain electrodes of the diodes.

A diode provided in a scanning line 1414 has the similar structure.

As mentioned above, protection diodes can be concurrently formed in an input stage according to the present invention. Further, the positions of the protection diodes are not limited thereto, and they can be provided between a driver circuit and a pixel.

This embodiment mode can be implemented by being freely combined with an appropriate structure of Embodiment Modes 1 to 8.

The light emitting device of the present invention having such a protection circuit is a light emitting device with high reliability and low power consumption. Further, by employing the structure described above, the reliability of the light emitting device can be further improved.

Embodiment Mode 10

Figure 17A:
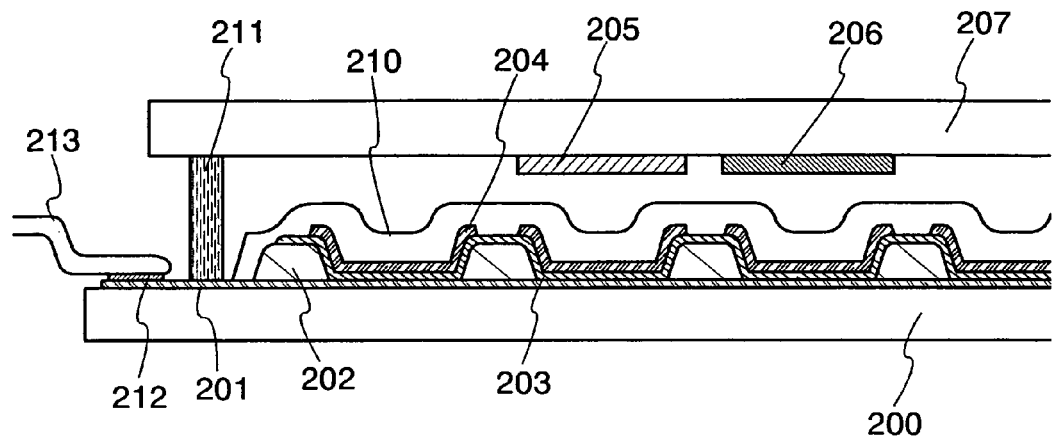
FIGS. 17A and 17B each are a cross-sectional view and a top view of a light emitting device of the present invention.

FIG. 17A shows a structure of a light emitting device of the present invention as an example. FIG. 17A shows a portion of a cross-sectional view of a pixel portion of a passive matrix light emitting device with a tapered structure. The light emitting device of the present invention shown in FIG. 17A includes a substrate 200, a first electrode 201 of a light emitting element, a partition wall 202, a light emitting laminated body 203, a second electrode 204 of a light emitting element, and a counter substrate 207.

A light emitting element is formed in a portion in which the light emitting laminated body 203 is sandwiched between the first electrode 201 and the second electrode 204 of the light emitting element. The first electrode 201 and the second electrode 204 cross each other and are formed in stripe in which light emitting elements are formed at intersection portions. The partition wall 202 is formed in parallel to the second electrode 204, whereby the light emitting element is insulated from another light emitting element having the first electrode 201 in common.

In this embodiment mode, as for a specific material and structure of the first electrode 201, the second electrode 204, and the light emitting laminated body 203, any of Embodiment Modes 1 to 6 may be referred to.

Besides, the substrate 200, the partition wall 202, and the counter substrate 207 in FIG. 17A correspond to the substrate 50, the partition wall 65, and the counter substrate 94 in Embodiment Mode 7, respectively. The structures, materials, and effects thereof are similar to those of Embodiment Mode 1; therefore, the explanation will not be repeated; therefore, refer to the description in Embodiment Mode 7.

A protection film 210 is formed in a light emitting device to prevent moisture or the like from entering. A counter substrate 207 made of glass, quartz, or a ceramic material such as alumina, or a synthetic material thereof is fixed by a sealing adhesive agent 211. An external input terminal portion is connected to an external circuit through an anisotropic conductive film 212 by using a flexible printed wiring substrate 213. The protection film 210 may be made of silicon nitride, or may be formed of a stack of carbon nitride and silicon nitride to enhance a gas barrier property while decreasing stress.

Figure 17B:
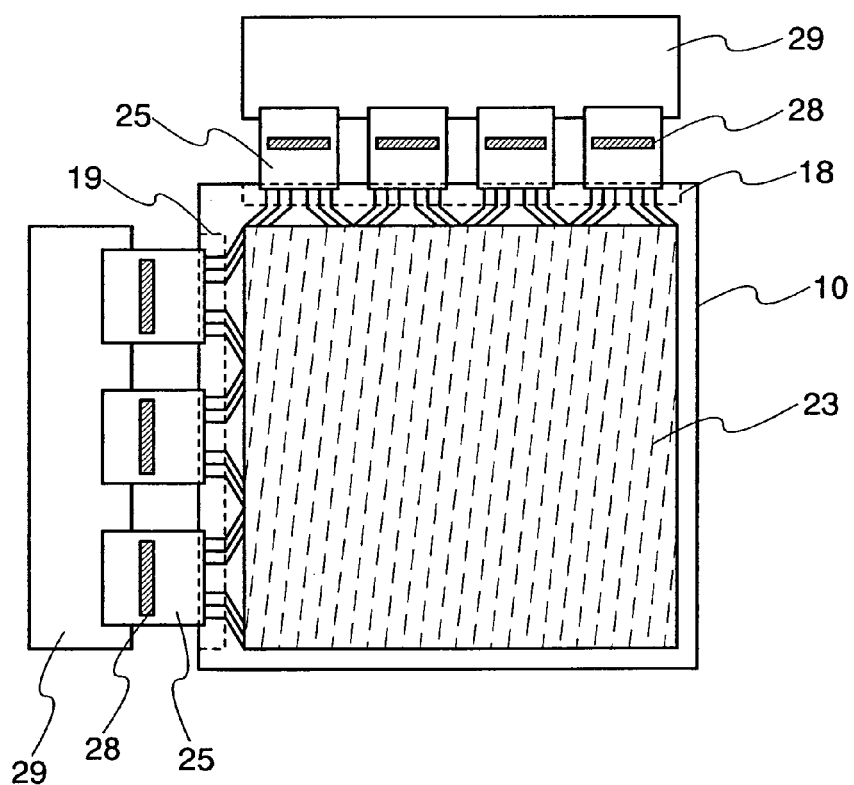
Figure 18:
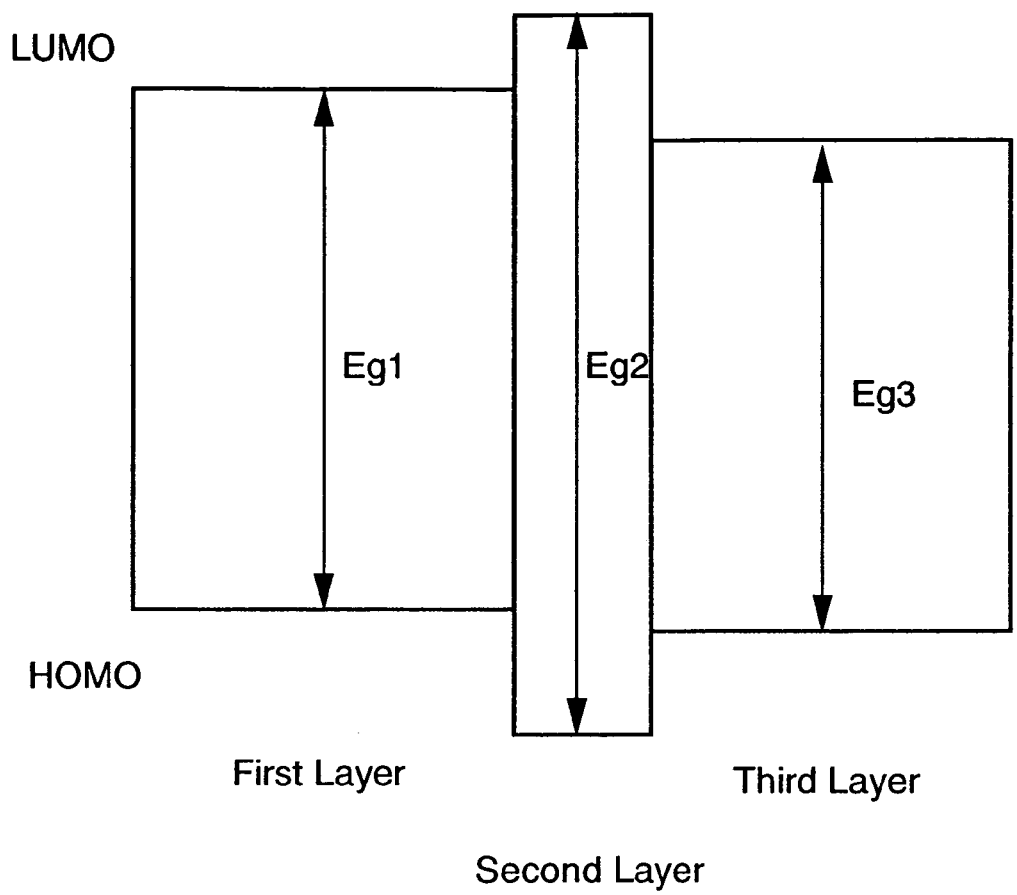
FIG. 18 is a view showing an energy gap, large and small, of the present invention.

FIG. 17B shows a module in which an external circuit is connected to the panel shown in FIG. 17A. The module is electrically connected to external circuit substrates in which a power source circuit and a signal processing circuit are formed by fixing a flexible printed wiring substrate 25 to external input terminal portions 18 and 19. Moreover, a driver IC 28 as one of the external circuits may be mounted by either a COG method or a TAB method. FIG. 17B shows the driver IC 28 as one of the external circuits mounted by a COG method.

It is to be noted that the panel and the module correspond to one mode of a light emitting device of the present invention and are both included in the scope of the present invention.

Embodiment Mode 11

As an electronic device of the present invention mounted with a light emitting device (module) of the present invention, a video camera, a digital camera, a goggle type display (head mounted display), a navigation system, an audio reproducing device (car audio component or the like), a computer, a game machine, a portable information terminal (e.g., a mobile computer, a mobile phone, a portable game machine, an electronic book, and the like), an image reproducing device equipped with a recording medium (concretely, a device having a display that can reproduce a recording medium such as a digital versatile disc (DVD) and can display an image thereof), and the like are given. Specific examples of these electronic devices are shown in FIGS. 11A to 11E.

Figure 11A:
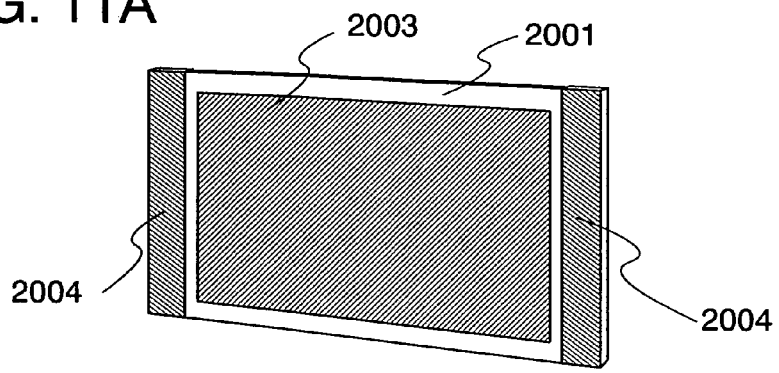
FIGS. 11A to 11E are views illustrating electronic devices to which the present invention can be applied.

FIG. 11A shows a light emitting device, which corresponds to a monitor for a television receiver, a personal computer, or the like, including a housing 2001, a display portion 2003, speaker portions 2004, and the like. The light emitting device of the present invention is a light emitting device, of which the display portion 2003 has high reliability, consuming low power. A pixel portion may be provided with a polarizing plate or a circularly polarizing plate to enhance contrast. For example, a ¼λ plate, a ½λ plate, and a polarizing plate may be provided to a sealing substrate in this order. Further, an anti-reflective film may be provided over the polarizing plate.

Figure 11B:
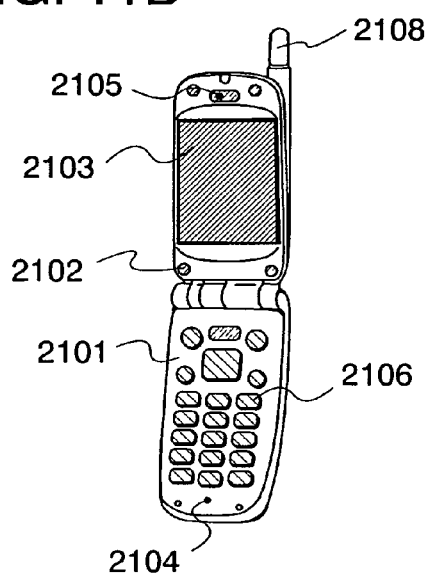

FIG. 11B shows a mobile phone, including a main body 2101, a housing 2102, a display portion 2103, an audio input portion 2104, an audio output portion 2105, operation keys 2106, an antenna 2108, and the like. The mobile phone of the present invention is a mobile phone, of which the display portion 2103 has high reliability, consuming low power.

Figure 11C:
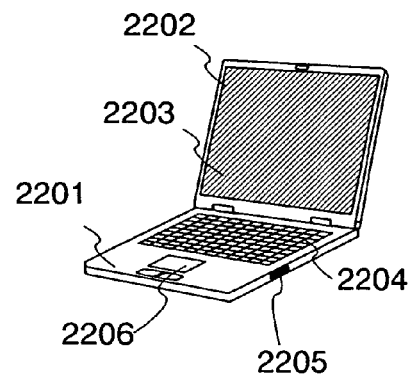

FIG. 11C shows a computer, including a main body 2201, a housing 2202, a display portion 2203, a keyboard 2204, an external connection port 2205, a pointing mouse 2206, and the like. The computer of the present invention is a computer, of which the display portion 2203 has high reliability, consuming low power. Although a laptop computer is illustrated in FIG. 11C, the present invention can be applied to a desktop computer in which a hard disk and a display portion are formed together, or the like.

Figure 11D:
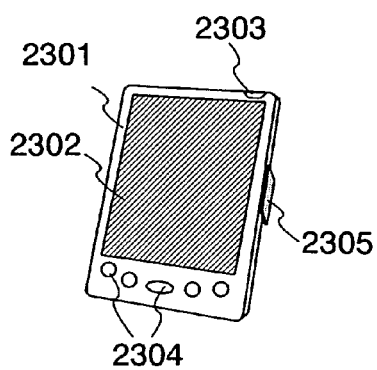

FIG. 11D shows a mobile computer, including a main body 2301, a display portion 2302, a switch 2303, operation keys 2304, an infrared port 2305, and the like. The mobile computer of the present invention is a mobile computer, of which the display portion 2302 has high reliability, consuming low power.

Figure 11E:
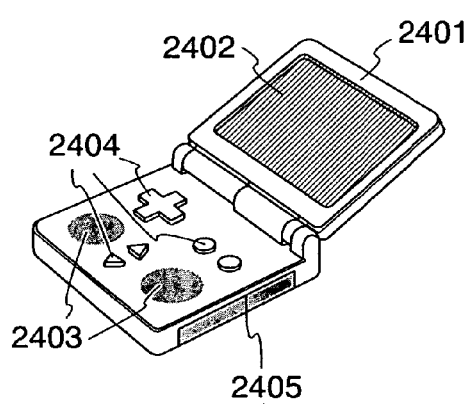

FIG. 11E shows a portable game machine, including a housing 2401, a display portion 2402, speaker portions 2403, operation keys 2404, a recording medium insert portion 2405, and the like. The portable game machine of the present invention is a portable game machine, of which the display portion 2402 has high reliability, consuming low power.

As described above, the application range of the present invention is extremely wide and can be used for electronic devices in various fields.

This embodiment mode can be implemented by being freely combined with the appropriate structure in Embodiment Modes 1 to 10.

Embodiment 1

In this embodiment, a result of examining an energy gap of a second layer 102 with the use of a light emitting element of the present invention having a structure shown in FIG. 3A in Embodiment Mode 6 will be shown.

The light emitting element was formed over a glass substrate, and a first electrode 100, a sixth layer 107, a first layer 101, a second layer 102, a third layer 103, a fourth layer 105, a seventh layer 108, and a second electrode 104 were sequentially formed from a glass substrate side. As the first electrode 100, indium tin oxide containing silicon oxide (in this embodiment, referred to as ITSO) was formed to have a thickness of 110 nm. ITSO was deposited by a sputtering method, and a shape of the first electrode 100 was set to be 2 mm×2 mm by etching. Next, as pretreatment for forming the light emitting element, the surface of the substrate was washed with a porous resin (typically, one made of PVA (polyvinyl alcohol), nylon, or the like), heat treatment was conducted at 200° C. for 1 hour, and UV ozone treatment was conducted for 370 seconds.

Next, as the sixth layer 107, which is a hole injecting layer, a co-evaporation film of NPB (4,4'-bis[N-(1-naphthyl)-N-phenylamino]biphenyl) and molybdenum oxide was formed to have a thickness of 50 nm. It is to be noted that NPB and molybdenum oxide was deposited to have a mass ratio of 4:1. Subsequently, as a hole transporting layer, which is the first layer 101, NPB was deposited to have a thickness of 10 nm. Over these laminated films, the second layer 102 was formed to have a thickness of 2 nm, and as a light emitting layer, which is the third layer 103, CzPA (9-[4-(N-carbazolyl)]phenyl-10-phenylanthracene) and YGAPA (9-(4-{N-[4-(9-carbazolyl)phenyl]-N-phenylamino}phenyl)-10-phenylanthracene) were deposited to have a mass ratio of 1:0.04. CzPA serves as a host material and YGAPA serves as an emission center material. The light emitting layer is formed to have a thickness of 30 nm. Further, Alq$_3$ (tris(8-quinolinolato)aluminum) was formed to have a thickness of 30 nm as an electron transporting layer, which is the fourth layer 105, and lithium fluoride was formed to have a thickness of 1 nm as an electron injecting layer, which is the seventh layer 108. Subsequently, Al was deposited to have a thickness of 200 nm as the second electrode 104, thereby completing an element. Finally, sealing was conducted in a nitrogen atmosphere so that the element is not exposed to the air. The film formation from the hole injecting layer to the second electrode was conducted by a vacuum vapor deposition method using resistance heating.

An element using CBP (4,4'-di(N-carbazolyl)biphenyl) having an energy gap of 3.43 eV as a material for the second layer 102 was referred to as an element 1; an element using SFDCz (2,7-di(N-carbazolyl)-spiro-9,9'-bifluorene) of 3.28 eV, an element 2; an element using m-MTDATA (4,4',4"-tris[N-(3-methylphenyl)-N-phenylamino]triphenylamine) of 3.52 eV, an element 3; an element using YGASF (2,7-bis{N-[4-(N-carbazolyl)phenyl]-N-phenylamino}-spiro-9,9'-bifluorene) of 3.17 eV, an element 4; an element using TCzB (1,3,5-tri(N-carbazolyl)benzene) of 3.55 eV, an element 5; and an element using TCTA (4,4',4"-tris(N-carbazolyl)triphenylamine) of 3.31 eV, an element 6.

It is to be noted that an energy gap of NPB of the first layer 101, which is a hole transporting layer, is 2.97 eV, and an energy gap of CzPA, which is a host material, is 2.93 eV;

therefore, the elements 1 to 6 correspond to a light emitting element of the present invention.

As a comparative example, an element (element 7) using 4,4'-bis[N-(9,9-dimethylfluorene-2-yl)-N-phenylamino]biphenyl (abbreviation: DFLDPBi) as the second layer 102 having an energy gap of 2.97 eV was manufactured with the same structure as the elements 1 to 6 of the embodiment, and elements (elements 8 to 10) in which the existence of the second layer 102 is different from the elements 1 to 6 of the embodiment were manufactured. The elements 8 to 10 have the same structure.

Figure 12:
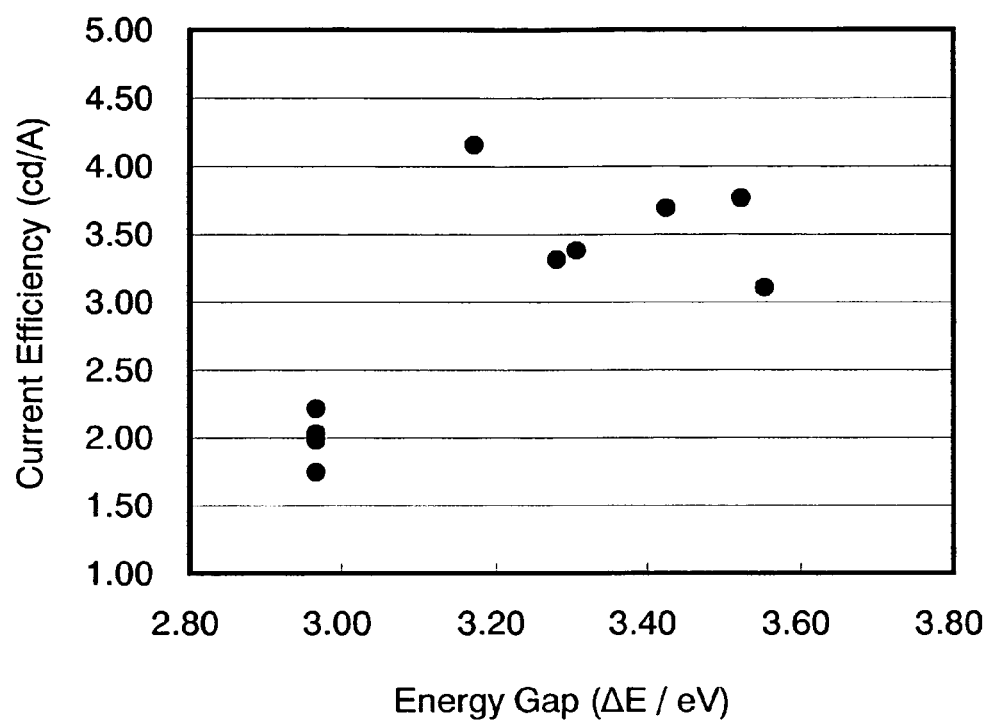
FIG. 12 is a view showing a relation between an energy gap and current efficiency of a second layer in elements 1 to 10.

Table 1 shows a table in which current efficiency, power efficiency, and the like of the elements 1 to 10 are summarized. FIG. 12 shows a graph with an energy gap of the second layer 102 on a horizontal axis and current efficiency at approximately 1000 cd/m$^2$ on a vertical axis. However, the second layer 102 is not formed in the elements 8 to 10; therefore, a value of NPB (2.97 eV) serving as the hole transporting layer, which is the first layer 101, is used for a value of an energy gap.

TABLE 1

|  | Energy Gap (eV) | Current Efficiency (cd/A) | Power Efficiency (lm/W) |
| --- | --- | --- | --- |
| Element 1 | 3.43 | 3.69 | 1.93 |
| Element 2 | 3.28 | 3.31 | 1.58 |
| Element 3 | 3.52 | 3.77 | 2.11 |
| Element 4 | 3.17 | 4.16 | 2.33 |
| Element 5 | 3.55 | 3.11 | 1.74 |
| Element 6 | 3.31 | 3.38 | 1.97 |
| Element 7 | 2.97 | 1.74 | 0.78 |
| Element 8 | — | 2.03 | 0.89 |
| Element 9 | — | 2.21 | 1.02 |
| Element 10 | — | 1.98 | 1.04 |

From FIG. 12 and Table 1, it is revealed that the elements 1 to 6, in which the second layer 102 is included between a carrier transporting layer and a light emitting layer and an energy gap of the second layer 102 is larger than that of the carrier transporting layer and equal to or larger than that of the host material, show a more favorable value of current efficiency and power efficiency than the element 7, which has an energy gap of the second layer smaller than that of the host material and equal to that of the carrier transporting layer, and the elements 8 to 10, in which the second layer 102 is not formed.

Thus, the light emitting element of the present invention is a light emitting element with high luminous efficiency. By the improvement of luminous efficiency, the same luminance can be obtained with the smaller amount of current than a conventional one, and deterioration of the light emitting element is suppressed. Accordingly, the light emitting element of the present invention is a light emitting element with improved reliability. In addition, power efficiency is also improved; therefore, it can be said that the light emitting element consumes low power.

Embodiment 2

In this embodiment, a result of examining a thickness of a second layer 102 with the use of a light emitting element of the present invention having the structure shown in FIG. 3A in Embodiment Mode 6 will be shown.

The light emitting element was formed over a glass substrate, and a first electrode 100, a sixth layer 107, a first layer 101, a second layer 102, a third layer 103, a fourth layer 105, a seventh layer 108, and a second electrode 104 were sequentially formed from a glass substrate side. As the first electrode 100, ITSO was formed to have a thickness of 110 nm. ITSO was deposited by a sputtering method, and a shape of the first electrode 100 was set to be 2 mm×2 mm by etching. Next, as pretreatment for forming a light emitting element, the surface of the substrate was washed with a porous resin (typically, one made of PVA (polyvinyl alcohol), nylon, or the like), heat treatment was conducted at 200° C. for 1 hour, and UV ozone treatment was conducted for 370 seconds.

Next, as the sixth layer 107, which is a hole injecting layer, a co-evaporation film of NPB and molybdenum oxide was formed to have a thickness of 50 nm. It is to be noted that NPB and molybdenum oxide was deposited to have a mass ratio of 4:1. Subsequently, as a hole transporting layer, which is the first layer 101, NPB was deposited to have a thickness of 10 nm. Over these laminated films, CBP was deposited as the second layer 102, and CzPA and YGAPA were deposited as a light emitting layer, which is the third layer 103, to have a mass ratio of 1:0.04. CzPA serves as a host material and YGAPA serves as an emission center material. The light emitting layer is formed to have a thickness of 30 nm. Further, Alq$_3$ was formed to have a thickness of 30 nm as an electron transporting layer, which is the fourth layer 105, and lithium fluoride was formed to have a thickness of 1 nm as an electron injecting layer, which is the seventh layer 108. Subsequently, Al was deposited to have a thickness of 200 nm as the second electrode 104, thereby completing an element. Finally, sealing was conducted in a nitrogen atmosphere so that the element is not exposed to the air. The film formation from the hole injecting layer to the second electrode was conducted by a vacuum vapor deposition method using resistance heating.

In this embodiment, two types of light emitting elements of the present invention were manufactured as described above. An element in which the second layer 102 was formed to have a thickness of 1 nm was referred to as an element 11; and an element in which the second layer 102 was formed to have a thickness of 2 nm, an element 12. As a comparative example, an element in which a thickness of the second layer 102 is 0 nm (normal element in which the second layer 102 is not formed) and an element in which a thickness of the second layer is 5 nm were also formed, which were referred to as an element 13 and an element 14, respectively.

Figure 13:
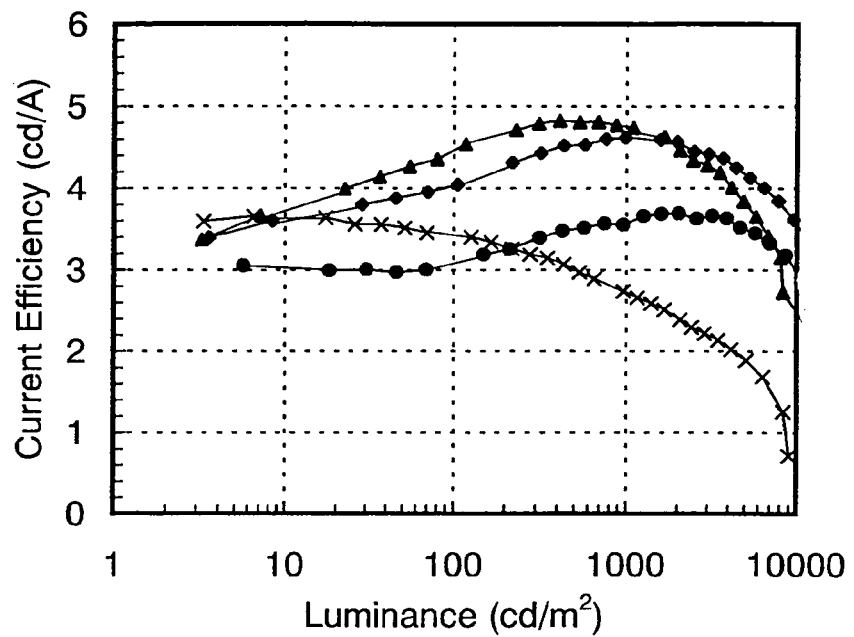
FIG. 13 is a view showing luminance-current efficiency characteristics of elements 11 to 14.
Figure 14:
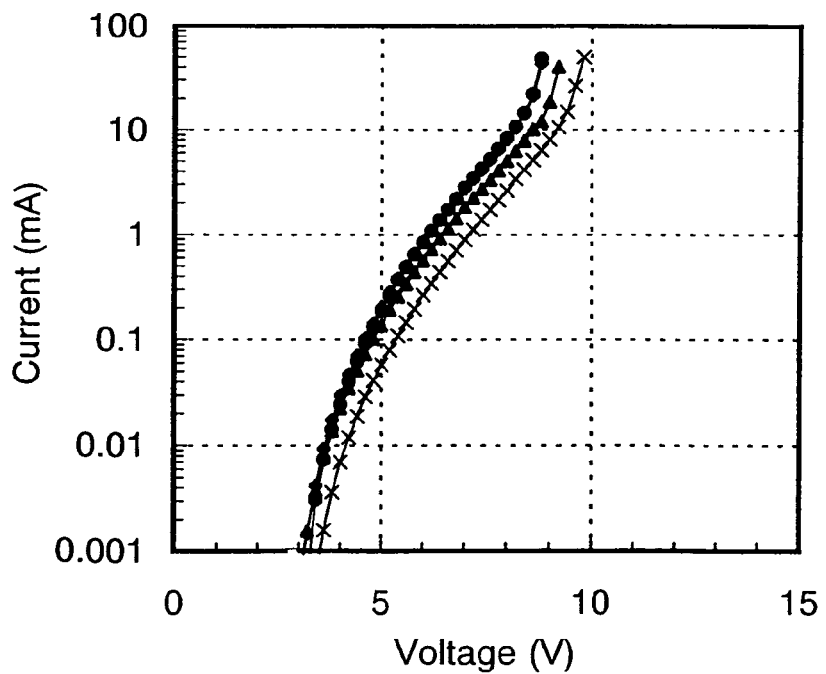
FIG. 14 is a view showing voltage-current characteristics of elements 11 to 14.
Figure 15:
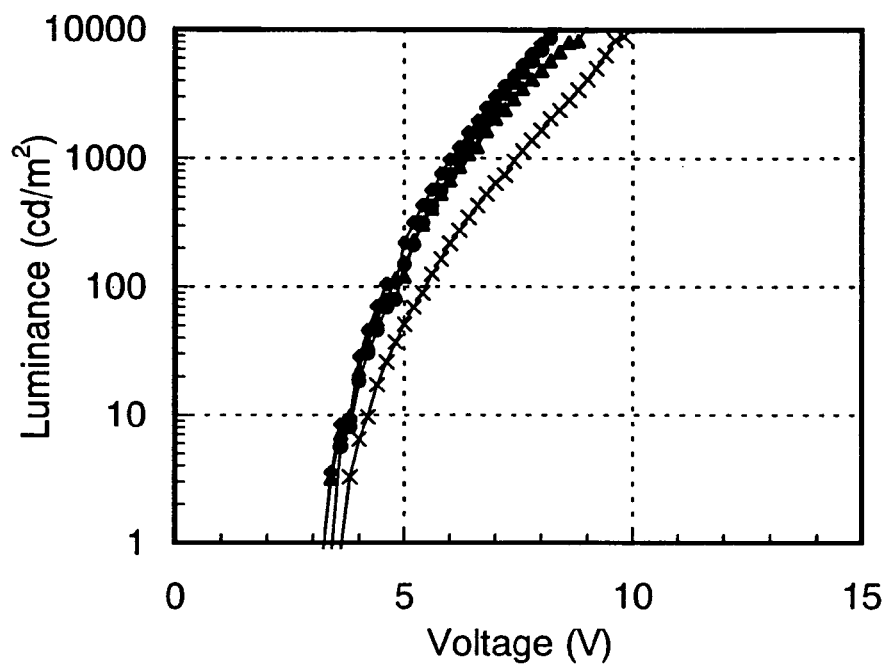
FIG. 15 is a view showing voltage-luminance characteristics of elements 11 to 14.

FIG. 13 shows luminance-current efficiency characteristics; FIG. 14, voltage-current characteristics; and FIG. 15, voltage-luminance characteristics of the elements 11 to 14. In these drawings, characteristics of the element 11 are indicated by ♦; characteristics of the element 12, ▲; characteristics of the element 13, •; and characteristics of the element 14, x. Further, Table 2 shows a table in which element characteristics when the elements 11 to 14 are made to emit light at approximately 1000 cd/m$^2$ are summarized.

TABLE 2

|  | Voltage (V) | Current Density (mA/cm²) | Chromaticity X | Chromaticity Y | Current Efficiency (cd/A) | Power Efficiency (lm/W) |
|---|---|---|---|---|---|---|
| Element 11 | 6.0 | 21.2 | 0.17 | 0.16 | 4.61 | 2.42 |
| Element 12 | 6.4 | 23.0 | 0.17 | 0.15 | 4.74 | 2.33 |
| Element 13 | 6.2 | 26.9 | 0.17 | 0.16 | 3.55 | 1.80 |
| Element 14 | 7.4 | 35.0 | 0.16 | 0.14 | 2.74 | 1.16 |

It is revealed that both of current efficiency and power efficiency of the elements 11 and 12, which are light emitting elements of the present invention, are drastically improved compared with the elements 13 and 14, which are comparative examples.

In other words, the light emitting element of the present invention is a light emitting element with high luminous efficiency. By the improvement of luminous efficiency, the same luminance can be obtained with the smaller amount of current than a conventional one, and deterioration of the light emitting element is suppressed. Accordingly, the light emitting element with improved reliability is obtained. In addition, power efficiency is also improved; therefore, it is revealed that the light emitting element consumes low power.

Embodiment 3

In this embodiment, a result of applying the present invention to a light emitting element in which the structure of a light emitting layer is different from Embodiments 1 and 2 will be shown. The structure of FIG. 3A of Embodiment Mode 6 is used for an element structure in the same manner as Embodiments 1 and 2.

The light emitting element was formed over a glass substrate, and a first electrode 100, a sixth layer 107, a first layer 101, a second layer 102, a third layer 103, a fourth layer 105, a seventh layer 108, and a second electrode 104 were sequentially formed from a glass substrate side. As the first electrode 100, ITSO was formed to have a thickness of 110 nm. ITSO was deposited by a sputtering method, and a shape of the first electrode 100 was set to be 2 mm×2 mm by etching. Next, as pretreatment for forming a light emitting element, the surface of the substrate was washed with a porous resin (typically, one made of PVA (polyvinyl alcohol), nylon, or the like), heat treatment was conducted at 200° C. for 1 hour, and UV ozone treatment was conducted for 370 seconds.

Next, as the sixth layer 107, which is a hole injecting layer, DNTPD (4,4'-bis{N-[4-(N,N-di-m-tolylamino)phenyl]-N-phenylamino}biphenyl) was formed to have a thickness of 50 nm. Subsequently, as a hole transporting layer, which is the first layer 101, NPB (4,4'-bis[N-(1-naphthyl)-N-phenylamino]biphenyl) was deposited to have a thickness of 10 nm. Over these laminated films, CBP (4,4'-di(N-carbazolyl)biphenyl) was deposited to have a thickness of 2 nm as the second layer 102, and $Alq_3$ (tris(8-quinolinolato)aluminum) and coumarin 6 were deposited as a light emitting layer, which is the third layer 103, to have a mass ratio of 1:0.01. $Alq_3$ serves as a host material and coumarin 6 serves as an emission center material. The light emitting layer was formed to have a thickness of 40 nm. Further, $Alq_3$ was formed to have a thickness of 10 nm as an electron transporting layer, which is the fourth layer 105, and a co-evaporation film of $Alq_3$ and lithium was formed to have a thickness of 30 nm as an electron injecting layer, which is the seventh layer 108. It is to be noted that $Alq_3$ and lithium were deposited to have a mass ratio of 1:0.01. Subsequently, Al was deposited to have a thickness of 200 nm as the second electrode 104, thereby completing an element. Finally, sealing was conducted in a nitrogen atmosphere so that the element is not exposed to the air. The film formation from the hole injecting layer to the second electrode was conducted by a vacuum vapor deposition method using resistance heating. An element manufactured as described above is referred to as an element 15.

It is to be noted that an energy gap of $Alq_3$ is 2.71 eV.

As a comparative example, a light emitting element was manufactured, in which almost the same structure as the element 15 is employed and only the second layer is not included. The light emitting element was referred to as an element 16.

Table 3 shows a table in which element characteristics at approximately 1000 cd/m² of the elements 15 and 16 are summarized.

TABLE 3

|  | Voltage (V) | Current Density (mA/cm²) | Chromaticity X | Chromaticity Y | Current Efficiency (cd/A) | Power Efficiency (lm/W) |
|---|---|---|---|---|---|---|
| Element 15 | 6.6 | 10.2 | 0.34 | 0.61 | 9.28 | 4.42 |
| Element 16 | 6.8 | 11.8 | 0.34 | 0.61 | 8.09 | 3.74 |

The element 15 of the embodiment showed a more favorable value in both of current efficiency and power efficiency than the element 16 of a comparative example.

Accordingly, a light emitting element of the present invention is a light emitting element with high luminous efficiency. By the improvement of luminous efficiency, the same luminance can be obtained with the smaller amount of current than a conventional one, and deterioration of the light emitting element is suppressed. Accordingly, the light emitting element with improved reliability is obtained. In addition, power efficiency is also improved; therefore, it can be said that the light emitting element consumes low power.

Embodiment 4

Figure 16:
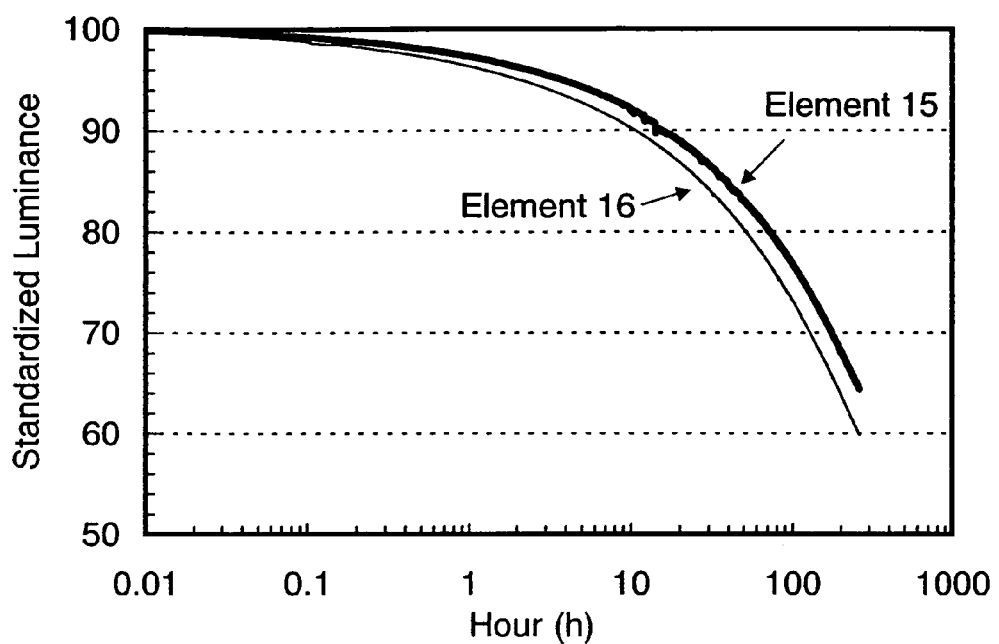
FIG. 16 is a view showing a relation between driving time and luminance in fixed current density of elements 15 and 16.

In this embodiment, FIG. 16 shows a graph showing the change in luminance with respect to driving time of the elements 15 and 16 described in Embodiment 3 under the condition where initial luminance is 3000 cd/m² and current density is fixed.

FIG. 16 shows that there is almost no difference in characteristics between the element 15, which is a light emitting element of the present invention having the second layer made of CBP, and the element 16 in which the second layer is not included, if anything, the element 15 shows characteristics which are slightly more favorable. In other words, the elements 15 and 16 are elements having almost the same reliability, if anything, the element 15 has reliability which is slightly more favorable than the element 16.

Reliability of CBP as a material for a light emitting layer is not so favorable, and there is a fear that reliability of a light emitting element itself is also reduced when CBP is formed as the second layer to have a certain thickness in the light emitting element. However, from the result that the element 15 using CBP has reliability equal to or higher than that of the element 16 not using CBP, it is revealed that a material of which reliability is not so high can be used for the second layer of the present invention without reduction in reliability of a light emitting element. It can be estimated that this is because the degree of an effect as the second layer exceeds the degree of an adverse effect on reliability since a thickness may be decreased when CBP is used as the second layer.

Embodiment 5

In this embodiment, a result of applying the present invention to a light emitting element in which the structure of a light emitting layer is different from that in Embodiments 1 to 3 will be shown. The structure of FIG. 3A of Embodiment Mode 6 is used for an element structure in the same manner as Embodiments 1 to 3.

The light emitting element was formed over a glass substrate, and a first electrode 100, a sixth layer 107, a first layer 101, a second layer 102, a third layer 103, a fourth layer 105, a seventh layer 108, and a second electrode 104 were sequentially formed from a glass substrate side. As the first electrode 100, indium tin oxide containing silicon oxide (in this embodiment, referred to as ITSO) was formed to have a thickness of 110 nm. ITSO was deposited by a sputtering method, and a shape of the first electrode 100 was set to be 2 mm×2 mm by etching. Next, as pretreatment for forming a light emitting element, the surface of the substrate was washed with a porous resin (typically, one made of PVA (polyvinyl alcohol), nylon, or the like), heat treatment was conducted at 200° C. for 1 hour, and UV ozone treatment was conducted for 370 seconds.

Next, as the sixth layer 107, which is a hole injecting layer, a co-evaporation film of NPB (4,4'-bis[N-(1-naphthyl)-N-phenylamino]biphenyl) and molybdenum oxide was formed to have a thickness of 50 nm. It is to be noted that NPB and molybdenum oxide was deposited to have a mass ratio of 4:1. Subsequently, as a hole transporting layer, which is the first layer 101, NPB was deposited to have a thickness of 10 nm.

Over these laminated films, the second layer 102 was deposited to have a thickness of 2 nm. As the second layer 102, YGASF (2,7-bis{N-[4-(N-carbazolyl)phenyl]-N-phenylamino}-spiro-9,9'-bifluorene) was used. An energy gap of YGASF is 3.17 eV.

As a light emitting layer, which is the third layer 103, ZnBOX (bis[2-(2-hydroxyphenyl)benzoxazolato]zinc) and bis(2-phenylpyridinato-N,$C^{2'}$)iridium(III)acetylacetonate (abbreviation: Ir(ppy)$_2$(acac)) were deposited to have a mass ratio of 1:0.05. ZnBOX serves as a host material and Ir(ppy)$_2$(acac) serves as an emission center material. A thickness of the light emitting layer was set to 30 nm. An energy gap of ZnBOX is 2.96 eV. It is to be noted that Ir(ppy)$_2$(acac) serves as emission center of phosphorescent emission.

Further, BAlq (bis(2-methyl-8-quinolinolato)-4-phenylphenolato-aluminum) was formed to have a thickness of 10 nm as an electron transporting layer, which is the fourth layer 105, and Alq$_3$ (tris(8-quinolinolato)aluminum) and lithium (Li) were deposited to have a mass ratio of 1:0.01 as an electron injecting layer, which is the seventh layer 108. It is to be noted that a co-evaporation film of Alq$_3$ and lithium was formed to have a thickness of 20 nm.

Subsequently, Al was deposited to have a thickness of 200 nm as the second electrode 104, thereby completing an element. Finally, sealing was conducted in a nitrogen atmosphere so that the element is not exposed to the air. The film formation from the hole injecting layer to the second electrode was conducted by a vacuum vapor deposition method using resistance heating. An element manufactured as described above is referred to as an element 18.

As a comparative example, a light emitting element was manufactured, in which almost the same structure as the element 18 is employed, and only the second layer 102 is not included. The light emitting element was referred to as an element 17.

Figure 19:
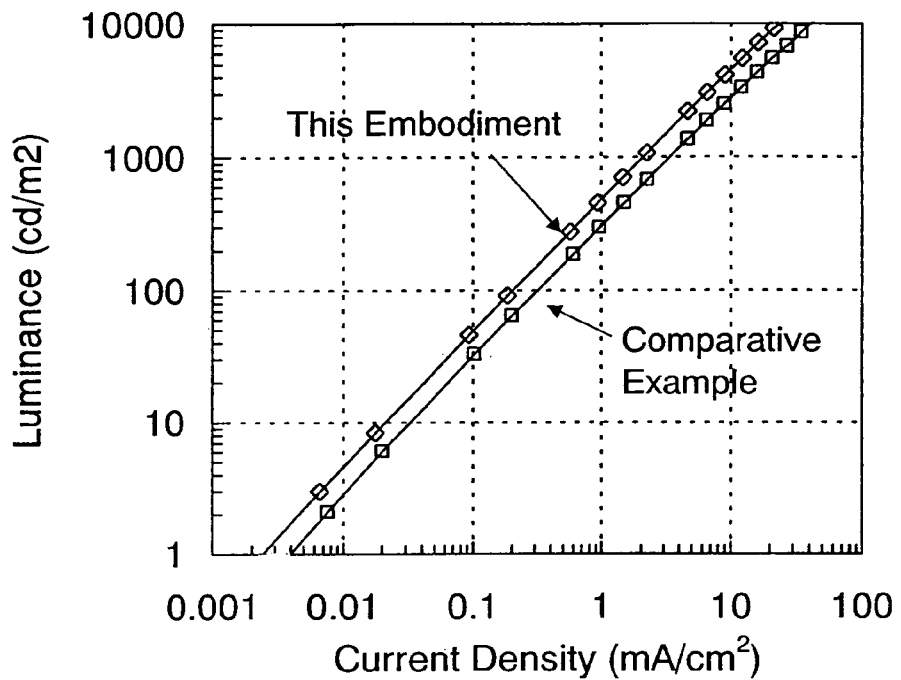
FIG. 19 is a view showing current density-luminance characteristics of elements 17 and 18.
Figure 20:
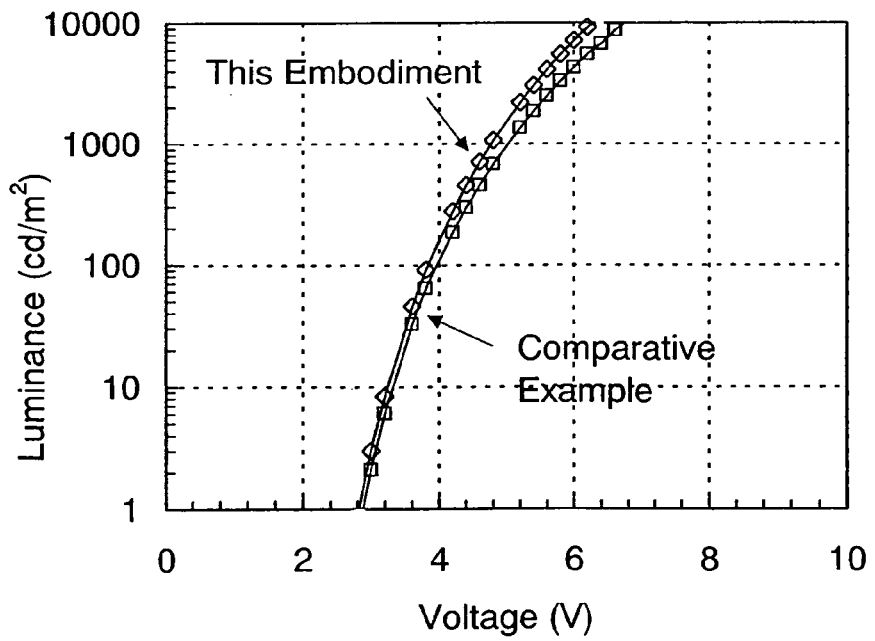
FIG. 20 is a view showing voltage-luminance characteristics of elements 17 and 18.
Figure 21:
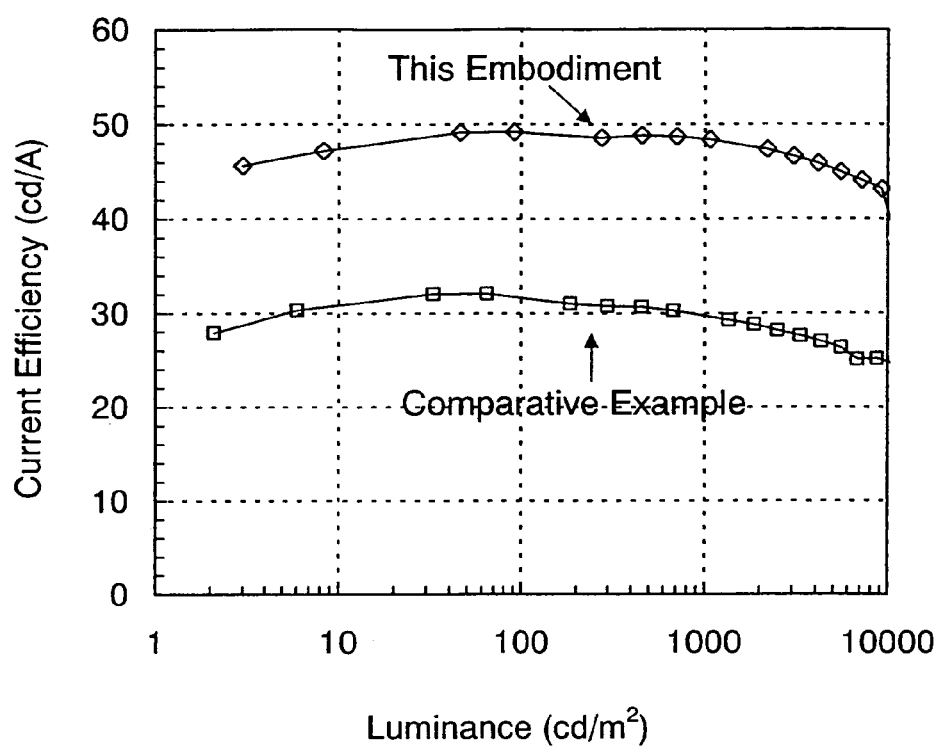
FIG. 21 is a view showing luminance-current efficiency characteristics of elements 17 and 18.
Figure 22:
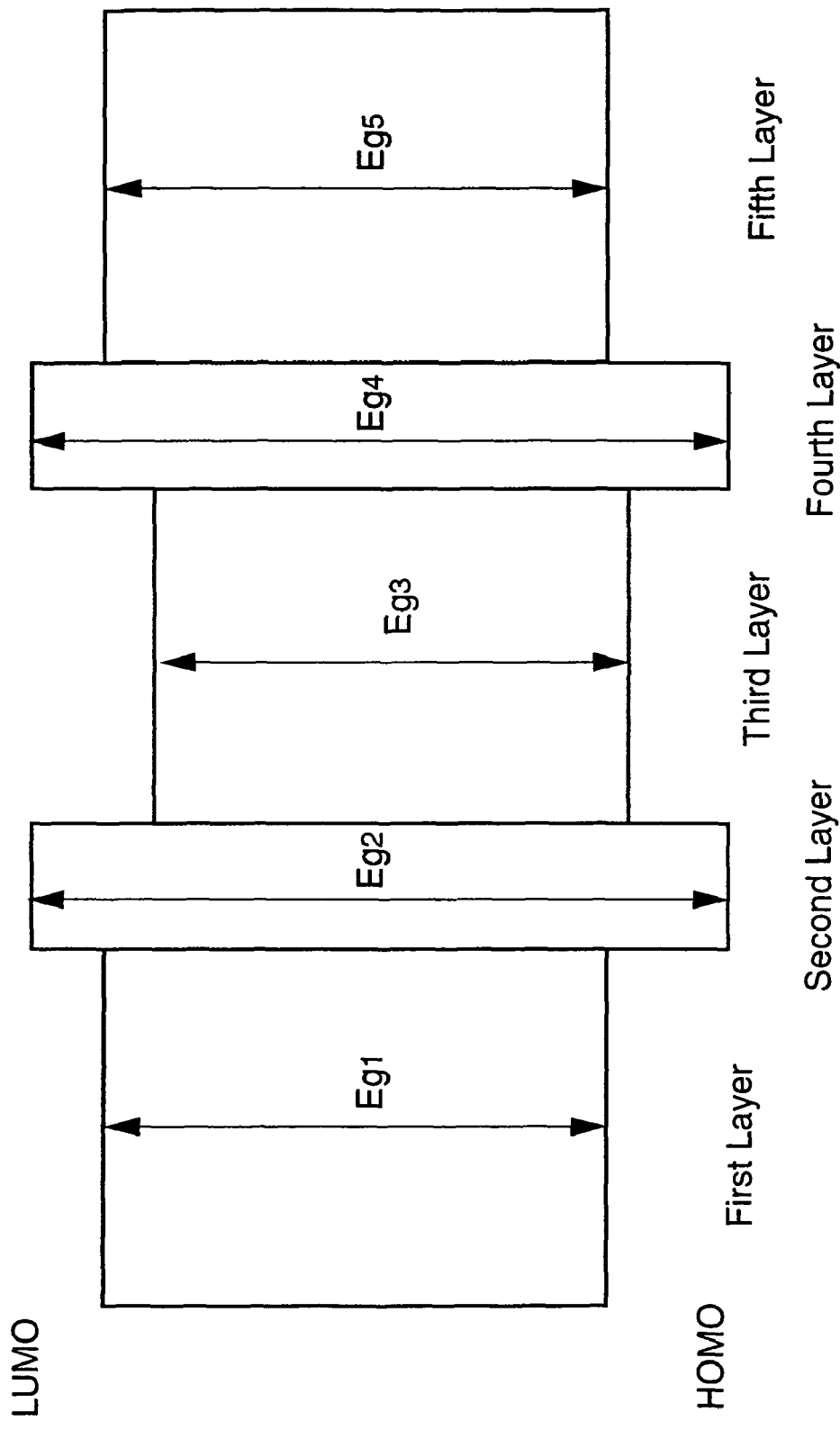
FIG. 22 is a view showing an energy gap, large and small, of the present invention.

FIG. 19 shows current density-luminance characteristics, FIG. 20 shows voltage-luminance characteristics, and FIG. 21 shows luminance-current efficiency characteristics. It is to be noted that □ indicates an element 17 (comparative example) and ◇ indicates an element 18 (this embodiment).

Table 4 shows a table in which element characteristics of the elements 17 and 18 at approximately 1000 cd/m$^2$ are summarized.

TABLE 4

|  | Voltage (V) | Current Density (mA/cm$^2$) | Chromaticity X | Chromaticity Y | Current Efficiency (cd/A) | Power Efficiency (lm/W) |
|---|---|---|---|---|---|---|
| Element 17 | 5 | 3.38 | 0.35 | 0.62 | 29.8 | 18.7 |
| Element 18 | 4.8 | 2.07 | 0.35 | 0.62 | 48.4 | 31.7 |

When the element 17 is compared with the element 18, it is revealed that both of current efficiency and power density are drastically increased in the element 18 (this embodiment), and the element 18 shows a more favorable value than the element 17.

FIGS. 19 to 21 and Table 4 show that an element 18 of the present invention is a light emitting element with high luminous efficiency. By the improvement of luminous efficiency, the same luminance can be obtained with the smaller amount of current than a conventional one, and deterioration of the light emitting element is suppressed. Accordingly, the light emitting element with improved reliability is obtained. In addition, power efficiency is also improved; therefore, it can be said that the light emitting element consumes low power.

REFERENCE EXAMPLE

YGAPA (9-(4-{N-[4-(9-carbazolyl)phenyl]-N-phenylamino}phenyl)-10-phenylanthracene) and CzPA (9-[4-(N-carbazolyl)]phenyl-10-phenylanthracene) Used in Embodiments 1 and 2 are novel substances; therefore, a synthetic method will be described hereinafter.

First, a synthetic method of YGAPA represented by the following structural formula (1) will be explained.

[Chem. 1]

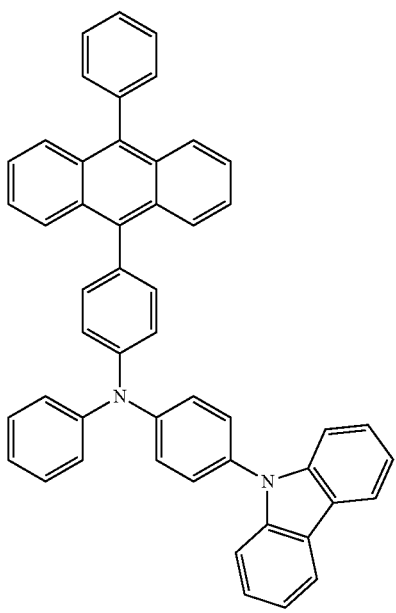

(1)

[Step 1: Synthesis of 9-[4-(N-phenylamino)phenyl]carbazole]

(i) Synthesis of N-(4-bromophenyl)carbazole 56.3 g (0.24 mol) of 1,4-dibromobenzene, 31.3 g (0.18 mol) of carbazole, 4.6 g (0.024 mol) of copper iodide, 66.3 g (0.48 mol) of potassium carbonate, and 2.1 g (0.008 mol) of 18-crown-6-ether were put into a 300 ml three-necked flask and nitrogen substitution was conducted. Then, 8 ml of 1,3-dimethyl-3,4,5,6-tetrahydro-2(1H)-pyrimidinone (also referred to as DMPU) was added and stirring was conducted for 6 hours at 180° C. After the temperature of the reaction mixture was lowered to room temperature, sediment was removed by suction filtration. The filtrate was washed with diluted hydrochloric acid, a saturated sodium hydrogen carbonate solution, and saturated saline in this order and then dried with magnesium sulfate. After the drying, the reaction mixture was naturally filtered and concentrated, and then the obtained oil-like substance is purified by silica gel column chromatography (hexane:ethyl acetate=9:1) and recrystallized by chloroform and hexane. Then, 20.7 g of a light-brown plate-like crystal, which was the intended object, was obtained with a yield of 35%.

Further, a synthetic scheme (b-1) of N-(4-bromophenyl)carbazole is shown below.

[Chem. 2]

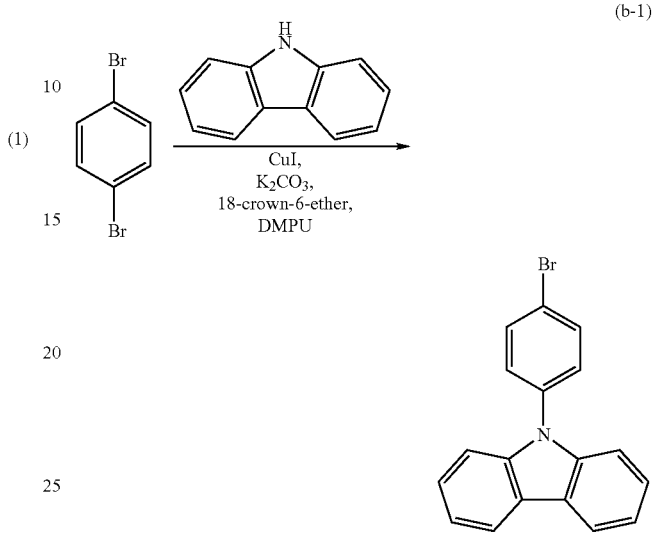

(b-1)

(ii) Synthesis of 9-[4-(N-phenylamino)phenyl]carbazole 5.4 g (17.0 mmol) of N-(4-bromophenyl)carbazole, 1.8 ml (20.0 mmol) of aniline, 100 mg (0.17 mmol) of bis(dibenzylideneacetone)palladium (O) (abbreviation: Pd(dba)$_2$), and 3.9 g (40 mmol) of sodium-tert-butoxide (abbreviation: tert-BuONa) were put into a 200 ml three-necked flask and nitrogen substitution was conducted. Then, 0.1 ml of tri-tert-butylphosphine (abbreviation: P(tert-Bu)$_3$) and 50 ml of toluene were added and stirring was conducted for 6 hours at 80° C. After the reaction mixture was filtered through florisil, Celite (registered trademark), and alumina and the filtrate was washed with water and saturated saline and then dried with magnesium sulfate. The reaction mixture was naturally filtered and concentrated, and then the obtained oil-like substance is purified by silica gel column chromatography (hexane:ethyl acetate=9:1), whereby 4.1 g of the intended object was obtained with a yield of 73%. By using a nuclear magnetic resonance method ($^1$H-NMR), it was confirmed that this compound was 9-[4-(N-phenylamino)phenyl]carbazole.

Further, a synthetic scheme (b-2) of 9-[4-(N-phenylamino)phenyl]carbazole is shown below.

[Chem. 3]

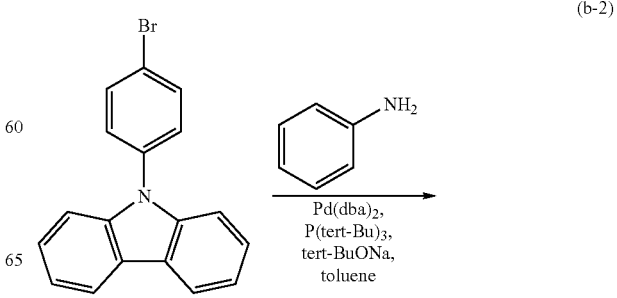

(b-2)

-continued

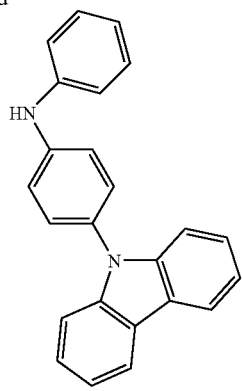

[Step 2: Synthesis of 9-(4-bromophenyl)-10-phenylanthracene (Abbreviation: PA)]
(i) Synthesis of 9-phenylanthracene 5.4 g (21.1 mmol) of 9-bromoanthracene, 2.6 g (21.1 mmol) of phenylboronic acid, 60 mg (0.21 mmol) of Pd(OAc)$_2$, 10 ml (20 mmol) of potassium carbonate (K$_2$CO$_3$) water solution with 2 mol/l, 263 mg (0.84 mmol) of tri(ortho tolyl)phosphine (P(o-tolyl)$_3$), and 20 ml of 1,2-dimethoxyethane (abbreviation: DME) were mixed and stirred at 80° C. for 9 hours. After reaction, precipitated solid was collected by suction filtration, and dissolved in toluene, and then filtered through florisil, Celite (registered trademark), and alumina. After the filtrate is washed with water and saturated saline, it was dried with magnesium sulfate. After the natural filtration, when the filtrate is condensed, 21.5 g of a light-brown solid of 9-phenylanthracene, which was the intended object, was obtained with a yield of 85% (synthetic scheme of (b-3)).

[Chem. 4]

(b-3)

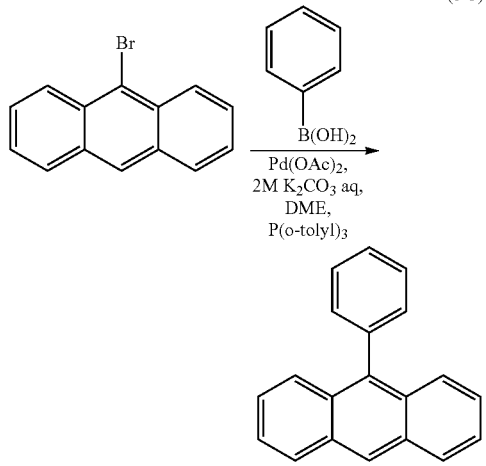

(ii) Synthesis of 9-bromo-10-phenylanthracene 6.0 g (23.7 mmol) of 9-phenylanthracene was dissolved in 80 ml of carbon tetrachloride, and a solution in which 3.80 g (21.1 mmol) of bromine was dissolved in 10 ml of carbon tetrachloride was dropped into the reaction solution by a dropping funnel. After the dropping, stirring was conducted for 1 hour at room temperature. After reaction, a sodium thiosulfate water solution was added and the reaction was stopped. An organic layer was washed with an NaOH water solution and a saturated saline and dried with magnesium sulfate. After the natural filtration, it was concentrated, dissolved in toluene, and filtered through florisil, Celite (registered trademark), and alumina. The filtrate was concentrated and recrystallized by dichloromethane and hexane. Then, 7.0 g of a light-yellow solid of 9-bromo-10-phenylanthracene, which was the intended object, was obtained with a yield of 89% (synthetic scheme of (b-4)).

[Chem. 5]

(b-4)

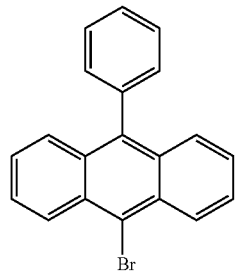

(iii) Synthesis of 9-iodo-10-phenylanthracene 3.33 g (10 mmol) of 9-bromo-10-phenylanthracene was dissolved in 80 ml of tetrahydrofuran (abbreviation: THF), and the temperature was lowered to −78° C. 7.5 ml (12.0 mmol) of n-BuLi (1.6M) was dropped into the reaction solution by a dropping funnel, and it was stirred for 1 hour. A solution in which 5 g (20.0 mmol) of iodine was dissolved in 20 ml of THF was dropped and stirred for 2 hours at −78° C. After reaction, a sodium thiosulfate water solution was added to stop the reaction. An organic layer was washed with a sodium thiosulfate water solution and a saturated saline and dried with magnesium sulfate. After the natural filtration, the filtrate was concentrated and the obtained solid was recrystallized by ethanol. Then, 3.1 g of a light-yellow solid of 9-iodo-10-phenylanthracene, which was the intended object, was obtained with a yield of 83% (synthetic scheme of (b-5)).

[Chem. 6]

(b-5)

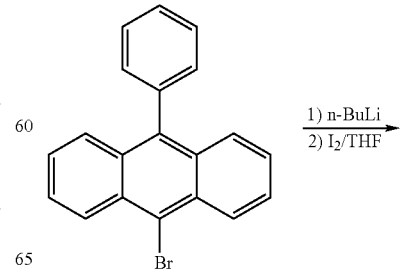

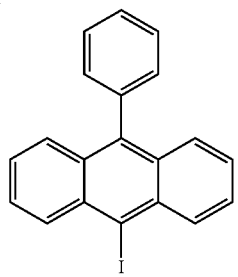

(iv) Synthesis of 9-(4-bromophenyl)-10-phenylanthracene (Abbreviation: PA)

1.0 g (2.63 mmol) of 9-iodo-10-phenylanthracene, 542 mg (2.70 mmol) of p-bromophenyl boronic acid, 46 mg (0.03 mmol) of Pd(PPh$_3$)$_4$, 3 ml (6 mmol) of potassium carbonate (K$_2$CO$_3$) water solution with 2 mol/L, and 10 ml of toluene were stirred at 80° C. for 9 hours. After reaction, toluene was added and filtration was conducted using florisil, Celite (registered trademark), and alumina. After the filtrate was washed with water and saturated saline, it was dried with magnesium sulfate. After natural filtration, the filtrate was concentrated, and when it is recrystallized with chloroform and hexane, 562 mg of a light brown solid of 9-(4-bromophenyl)-10-phenylanthracene, which was the intended object, was obtained with a yield of 45% (synthetic scheme of (b-6)).

[Chem. 7]

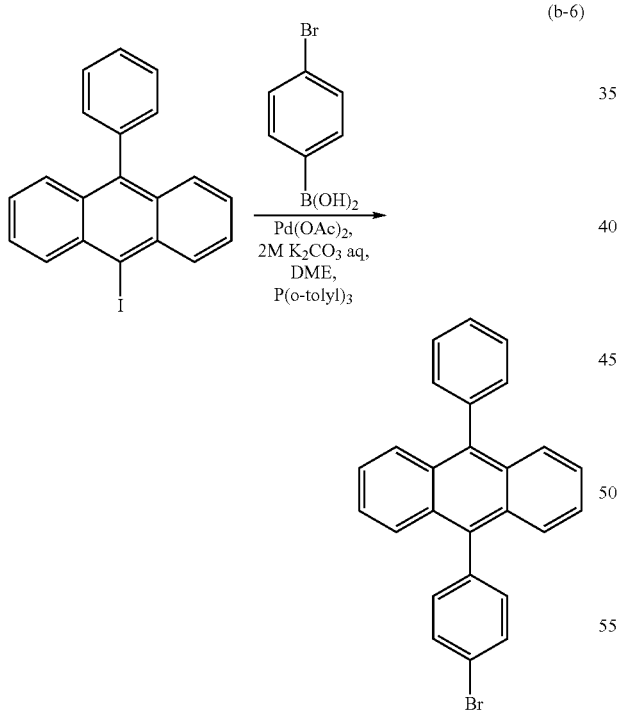

[Step 3: Synthesis of YGAPA]

409 mg (1.0 mmol) of 9-(4-bromophenyl)-10-phenylanthracene, 339 mg (1.0 mmol) of 9-[4-(N-phenylamino)phenyl]carbazole, 6 mg (0.01 mmol) of Pd(dba)$_2$, 500 mg (5.2 mol) of tert-BuONa, 0.1 ml of P(tert-Bu)$_3$, and 10 ml of toluene were stirred at 80° C. for 4 hours. After reaction, a solution was washed with water, a water layer was extracted using toluene, and it was washed together with the organic layer using saturated saline, and thereafter dried with magnesium sulfate. After natural filtration, the filtrate was concentrated and the obtained oil-like substance was purified by silica gel column chromatography (hexane:toluene=7:3) and recrystallized by dichloromethane and hexane. Then, a 534 mg of yellow powdered solid of YGAPA, which was the intended object, was obtained with a yield of 81% (synthetic scheme of (b-7)). When this compound was measured by a nuclear magnetic resonance method ($^1$H-NMR), it was confirmed that this compound was YGAPA.

[Chem. 8]

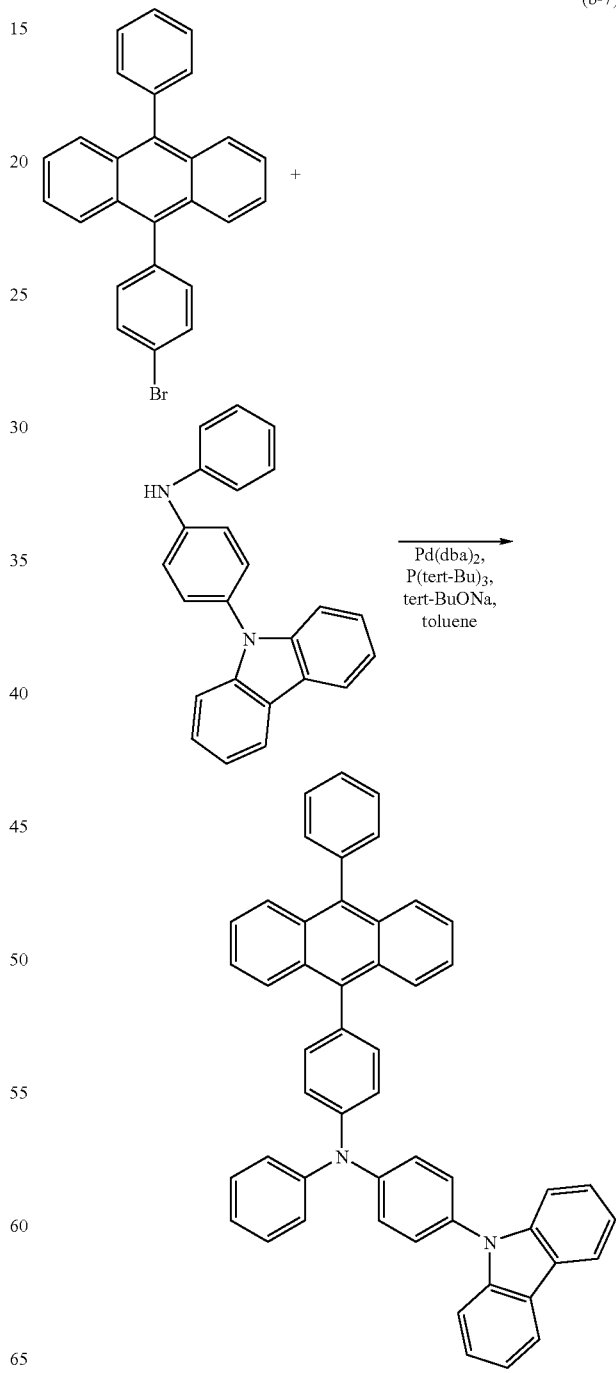

Subsequently, a synthetic method of CzPA represented by the following structural formula (2) will be explained.

[Chem. 9]

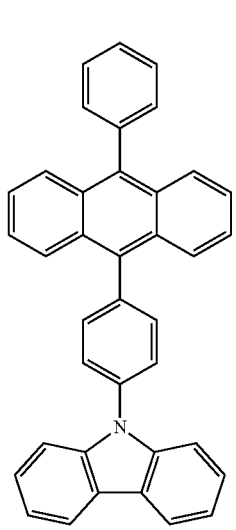

(2)

A synthetic method of CzPA using 9-(4-bromophenyl)-10-phenylanthracene obtained in the step 2 in synthesizing YGAPA as a starting material will be shown. A mixture of 1.3 g (3.2 mmol) of 9-(4-bromophenyl)-10-phenylanthracene, 578 mg (3.5 mmol) of carbazole, 50 mg (0.017 mmol) of bis(dibenzylideneacetone)palladium (O), 1.0 mg (0.010 mmol) of t-butoxy sodium, 0.1 mL of tri(t-butyl)phosphine, and 30 mL of toluene was heated to reflux at 110° C. for 10 hours. After reaction, the reaction solution was washed with water, a water layer was extracted with toluene, and it was washed together with the organic layer using saturated saline, and thereafter dried with magnesium sulfate. After natural filtration, the filtrate was concentrated and the obtained oil-like substance was purified by silica gel column chromatography (hexane:toluene=7:3) and recrystallized by dichloromethane and hexane. Then, 1.5 g of CzPA, which was the intended object, was obtained with a yield of 93%. Sublimation purification of 5.50 g of the obtained CzPA was conducted under conditions of at 270° C., under a stream of argon (flow rate: 3.0 ml/min), at a pressure of 6.7 Pa for 20 hours; thus, 3.98 g thereof was collected and the collection rate was 72%. A synthetic scheme of CzPA from 9-phenyl-10-(4-bromophenyl)anthracene is shown below. When this compound was measured by a nuclear magnetic resonance method ($^1$H-NMR), it was confirmed that this compound was CzPA.

[Chem. 10]

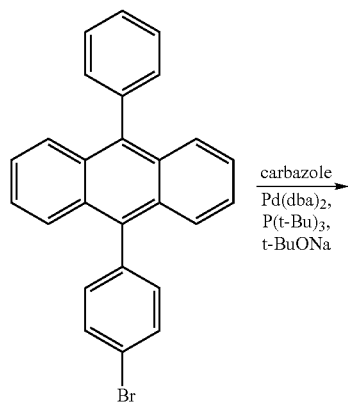

carbazole
Pd(dba)$_2$,
P(t-Bu)$_3$,
t-BuONa

-continued

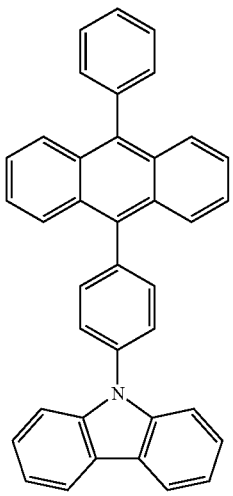

This application is based on Japanese Patent Application serial No. 2005-233603 filed in Japan Patent Office on Aug. 11, 2005, the entire contents of which are hereby incorporated by reference.

What is claimed is:

1. A compound having the formula: 2,7-bis{N-[4(N-carbazolyl)phenyl]-N-phenylamino}-spiro-9,9'-bifluorene.

2. A light emitting device comprising:
a first electrode;
a second electrode; and
a light emitting laminated body formed between the first electrode and the second electrode,
wherein the light emitting laminated body comprises a compound having the formula: 2,7-bis{N-[4(N-carbazolyl)phenyl]-N-phenylamino}-spiro-9,9'-bifluorene.

3. A light emitting device comprising:
a first electrode;
a second electrode; and
a light emitting laminated body formed between the first electrode and the second electrode,
wherein the light emitting laminated body comprises at least a first layer having a hole transporting property, a second layer, and a third layer, wherein the second layer is formed between the first layer and the third layer,
wherein the third layer comprises an emission center material and a host material in which the emission center material is dispersed, and
wherein the second layer comprises a compound having the formula: 2,7-bis{N-[4(N-carbazolyl)phenyl]-N-phenylamino}-spiro-9,9'-bifluorene.

4. A light emitting device comprising:
a first electrode;
a second electrode; and
a light emitting laminated body formed between the first electrode and the second electrode,
wherein the light emitting laminated body comprises at least a first layer having a hole transporting property, a second layer, and a third layer, wherein the second layer is formed between the first layer and the third layer,
wherein the third layer comprises an emission center material and a host material in which the emission center material is dispersed, and
wherein the second layer has an energy gap larger than an energy gap of the first layer and equal to or larger than an energy gap of the host material, and wherein the second layer comprises a compound having the formula: 2,7-bis{N-[4(N-carbazolyl)phenyl]-N-phenylamino}-spiro-9,9'-bifluorene.

5. A light emitting device comprising:
a first electrode;
a second electrode; and
a light emitting laminated body formed between the first electrode and the second electrode,
wherein the light emitting laminated body comprises at least a first layer having a hole transporting property, a second layer, a third layer, a fourth layer, and a fifth layer having an electron transporting property, wherein the second layer is formed between the first layer and the third layer, and wherein the fourth layer is formed between the third layer and the fifth layer,
wherein the third layer comprises an emission center material and a host material in which the emission center material is dispersed, and
wherein the second layer comprises a compound having the formula: 2,7-bis{N-[4(N-carbazolyl)phenyl]-N-phenylamino}-spiro-9,9'-bifluorene.

6. A light emitting device comprising:
a first electrode;
a second electrode; and
a light emitting laminated body formed between the first electrode and the second electrode,
wherein the light emitting laminated body comprises at least a first layer having a hole transporting property, a second layer, a third layer, a fourth layer, and a fifth layer having an electron transporting property, wherein the second layer is formed between the first layer and the third layer, and wherein the fourth layer is formed between the third layer and the fifth layer,
wherein the third layer comprises an emission center material and a host material in which the emission center material is dispersed,
wherein the second layer has an energy gap larger than an energy gap of the first layer and equal to or larger than an energy gap of the host material,
wherein the fourth layer has an energy gap larger than an energy gap of the fifth layer and equal to or larger than the energy gap of the host material, and
wherein the second layer comprises a compound having the formula: 2,7-bis{N-[4(N-carbazolyl)phenyl]-N-phenylamino}-spiro-9,9'-bifluorene.

7. The light emitting device according to claim 3,
wherein the second layer has a thickness between 0.1 nm and less than 5 nm.

8. The light emitting device according to claim 4,
wherein the second layer has a thickness between 0.1 nm and less than 5 nm.

9. The light emitting device according to claim 5,
wherein the second layer has a thickness between 0.1 nm and less than 5 nm.

10. The light emitting device according to claim 6,
wherein the second layer has a thickness between 0.1 nm and less than 5 nm.

11. The light emitting device according to claim 3,
wherein the emission center material is able to emit phosphorescence.

12. The light emitting device according to claim 4,
wherein the emission center material is able to emit phosphorescence.

13. The light emitting device according to claim 5,
wherein the emission center material is able to emit phosphorescence.

14. The light emitting device according to claim 6,
wherein the emission center material is able to emit phosphorescence.

* * * * *